United States Patent [19]

Hayami et al.

[11] Patent Number: 5,474,616
[45] Date of Patent: Dec. 12, 1995

[54] METHOD FOR RINSING PLATE-SHAPED ARTICLES

[75] Inventors: Yuka Hayami; Masanori Kobayashi; Ken Yamazaki, all of Kawasaki, Japan

[73] Assignee: Fujitsu Limited, Kawasaki, Japan

[21] Appl. No.: 44,064

[22] Filed: Apr. 6, 1993

[30] Foreign Application Priority Data

Apr. 7, 1992 [JP] Japan .................................. 4-084290

[51] Int. Cl.$^6$ ............................................... B08B 3/00
[52] U.S. Cl. ........................... 134/32; 134/34; 134/42; 134/902; 134/182; 134/183
[58] Field of Search ........................... 134/32, 34, 2, 134/902, 182, 183, 42

[56] References Cited

U.S. PATENT DOCUMENTS

| 4,997,490 | 3/1991 | Vetter et al. | 134/26 |
| 5,090,432 | 2/1992 | Bran | 134/139 |

FOREIGN PATENT DOCUMENTS 4-75341  3/1992  Japan .

OTHER PUBLICATIONS

Japanese patent abstract, Yukio Kanamori, Cleaning Method for . . . Substrate Feb. 13, 1992.

Primary Examiner—Michael Lewis
Assistant Examiner—Thomas G. Dunn, Jr.
Attorney, Agent, or Firm—Armstrong, Westerman, Hattori, McLeland & Naughton

[57] ABSTRACT

A plate-shaped article is immersed in a cleaning liquid filling a cleaning bath having an overflowing surface through which the cleaning liquid flows out, and is rinsed out. In the cleaning bath, streams mostly being directed away from a predetermined plane approximately perpendicular to the overflowing surface are formed. The plate-shaped article is then brought into the cleaning liquid having the stream maintaining a state where the plate-shaped article intersects the predetermined plane and the surfaces of the plate-shaped article are in approximately parallel to the streams mostly being directed away from the predetermined plane on the surface of the cleaning liquid.

2 Claims, 22 Drawing Sheets

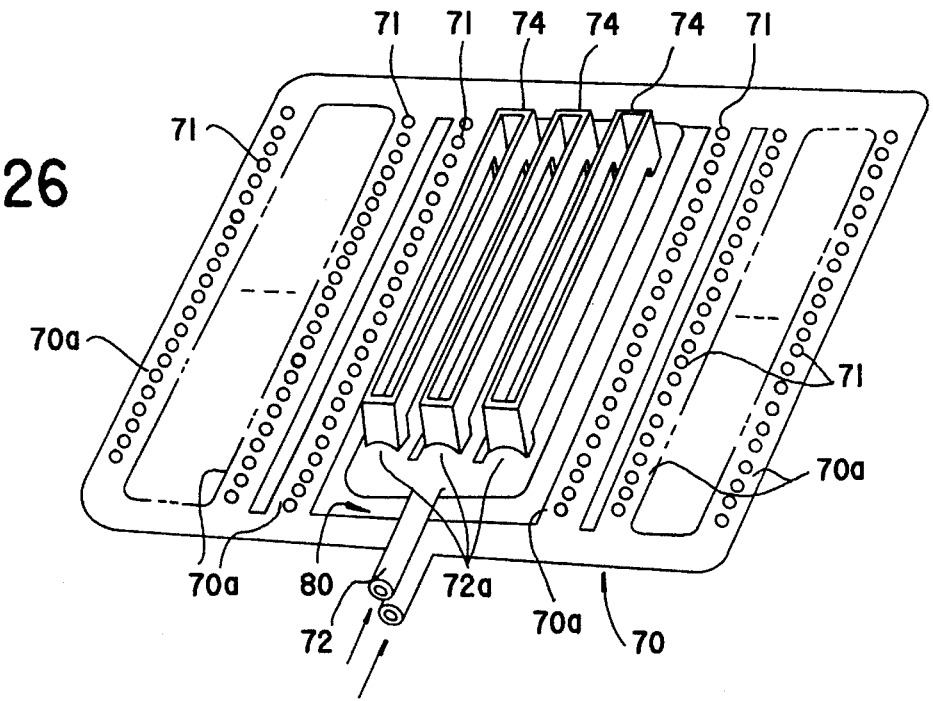
FIG.26
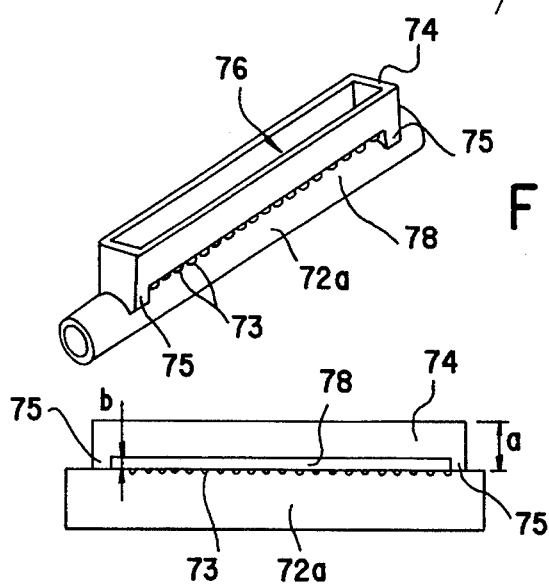
FIG.27(a)
FIG.27(b)
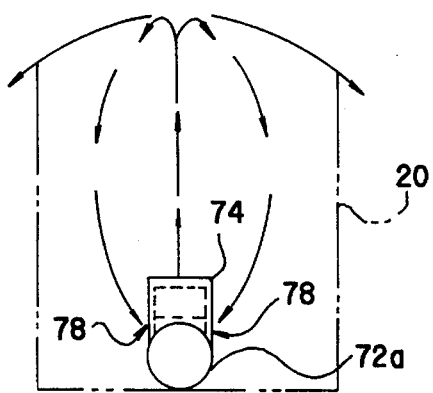
FIG.28

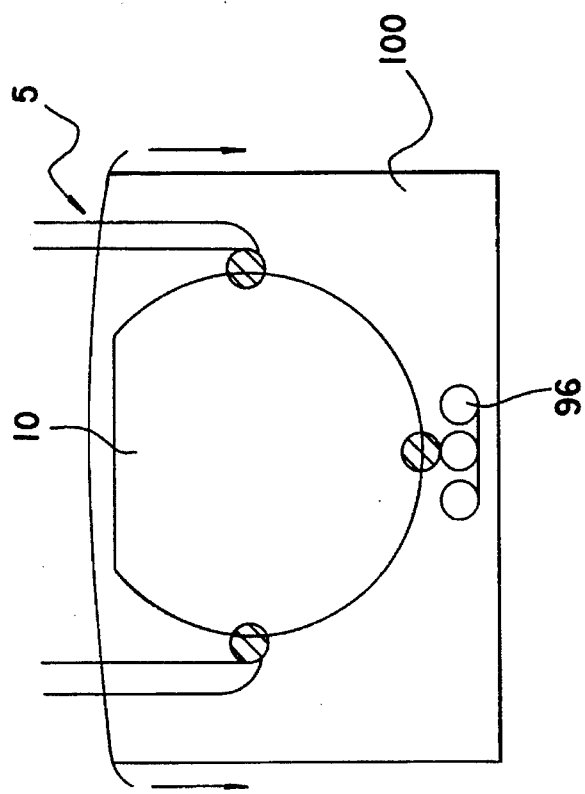
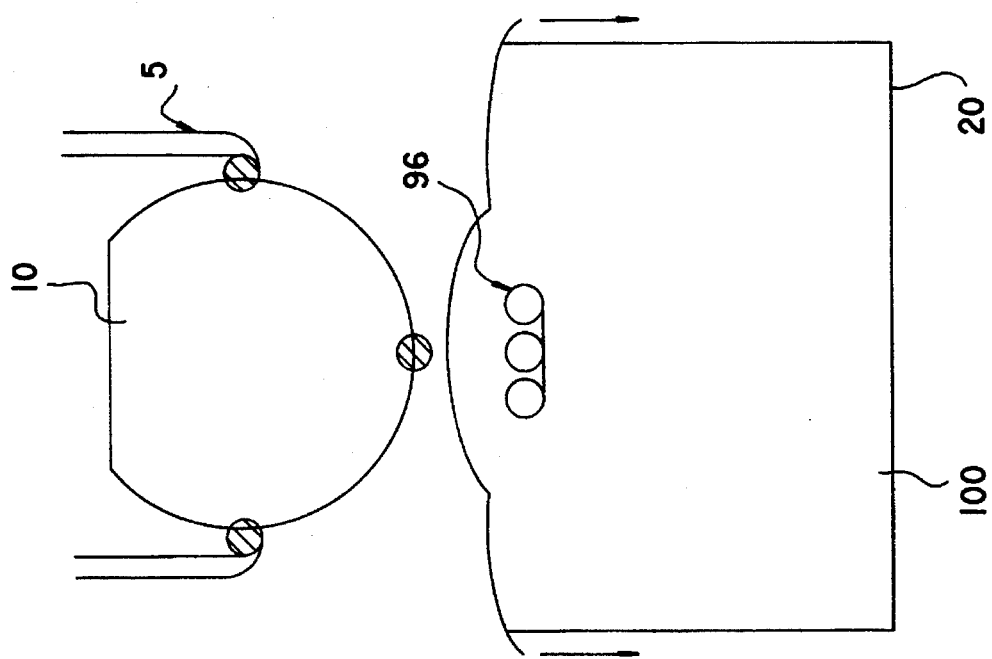
FIG.34(b)
FIG.34(a)

METHOD FOR RINSING PLATE-SHAPED ARTICLES

BACKGROUND OF THE INVENTION (1) Field of the Invention

The present invention relates to a method for rinsing plate shaped articles, such as semiconductor wafers, particles, and masks used in production of semiconductor devices, and to a cleaning bath and a cleaning equipment used in the method for rinsing the plate-shaped articles.

(2) Description of the Related Art

In, for example, a production process of a semiconductor device, after semiconductor wafers are treated with chemicals, the semiconductor wafers are rinsed using, for example, pure water. In particular, in a rinsing process to be performed immediately before a heat treatment process, or a CVD process, small particles must be completely removed from the surfaces of the semiconductor wafers with the metal impurity.

The semiconductor wafers are conventionally rinsed as follows.

Semiconductor wafers are set one by one in supporting grooves arranged at predetermined intervals in a carrier. The carrier in which the semiconductor wafers are set is immersed in a cleaner liquid which fills a cleaning bath so that a plurality of semiconductor wafers are rinsed in one lot in the cleaning bath. In addition, a rinsing method has been also proposed in which edges of a plurality of semiconductor wafers are held by a robot hanger in one lot, the semiconductor wafers held by the robot hanger being then immersed in a cleaner liquid so as to be rinsed.

In the above method in which the semiconductor wafers set in the carrier are rinsed, each of the semiconductor wafers 10 is set in a supporting groove 11a formed in the carrier 11, as shown in FIG. 1(a). When the carrier 11 in which each of the semiconductor wafers 10 are set in the supporting groove 11a in the manner as shown in FIG. 1(a) is transported, for example, from a chemical bath to a cleaning bath, an edge of each of the semiconductor wafers 10 vibrates due to the vibration of the carrier 11 in the transportation as shown in FIG. 1(b). In a case where the edge of each of the semiconductor wafers 10 vibrates in the supporting groove 11a, particles are generated. When the carrier 11 is formed of fluoroplastics softer than material (e.g. silicon) forming the semiconductor wafers, powder of the fluoroplastics is generated as the particles. When material formed of the carrier 11 is harder than silicon forming the semiconductor wafer, powder of the silicon is generated as the particles. These particles collect in the supporting grooves 11a.

When the carrier is brought into still water and the supporting groove 11a reaches the surface S of the still water in the above state where the particles have collected in the supporting groove 11a of the carrier 11, the particles P collected in the supporting groove 11a float and is dispersed on the surface S of the still water, as shown in FIG. 2(a). When the carrier is further placed under the still water, the particles P floating on the surface S of the still water are drawn toward the surfaces of each of the semiconductor wafers 10 as shown in FIG. 2(b). Thus, when the carriage 11 is pulled up from the still water, the particles adhere to the surfaces of each of the semiconductor wafers 10. In a case where the semiconductor wafers 10 are treated with hydrofluoric acid, the surfaces of each of the semiconductor wafers 10 have a hydrophobic property. In this case, it is particularly easy for the particles to adhere to the surfaces of each of the semiconductor wafers 10.

In a case where a plurality of semiconductor wafers having edges held by the robot hanger 5 is immersed in the cleaning liquid so as to be rinsed as shown in FIG. 3, particles are generated at portions at which hanger arms 5a, 5b and 5c supporting the semiconductor wafers are in contact with the edge of the semiconductor wafers 10 as shown in FIG. 4.

In an actual cleaning equipment, still water is not used for rinsing the semiconductor wafers. That is, the cleaning liquid (e.g. the pure water) 100 is jetted from a pipe provided on a bottom surface of a cleaning bath 20, as shown in FIGS. 5 and 6. In a state where the cleaning liquid 100 overflows from the cleaning bath 20, the semiconductor wafers 10 supported by, for example, the robot hanger 5, are immersed in the cleaning liquid 100. When the cleaning liquid 100 is jetted from the pipe 12 on the bottom surface of the cleaning bath 20 and the cleaning liquid 100 overflows from the cleaning bath 20, streams are formed on the surface of the cleaning liquid 100 as shown in FIG. 7. That is, streams generated in the circumference of the cleaning bath 20 uniformly travel toward the outside thereof, but streams generated in the middle of the surface of the cleaning liquid 20 are randomly directed. When the semiconductor wafers 10 are carried into the cleaning liquid in this state, the particles floating on the surface of the cleaning liquid 100 as described above stay on the surface of the cleaning liquid 100 for a long time. As a result, when the semiconductor wafers 10 are pulled up from the cleaning liquid 100 after immersing the semiconductor wafers 10 in the cleaning liquid 100, a the probability that the particles floating on the surface of the cleaning liquid 100 adhere to the surfaces of each of the semiconductor wafers 10 increases. Thus, the particles are not completely removed from the semiconductor wafers 10.

SUMMARY OF THE INVENTION

Accordingly, a general object of the present invention is to provide a novel and useful method for rising plate-shaped articles and a cleaning bath and a cleaning equipment used in the method such that the method, bath and equipment of this invention eliminate the above-discussed problems or drawbacks of the aforementioned prior art.

A more specific object of the present invention is to provide a method for rinsing plate-shaped articles such as the semiconductor wafers in which method, particles floating on the surface of a cleaning liquid in a cleaning bath flow out from the cleaning bath as soon as possible.

The above objects of the present invention are achieved by a method for rinsing a plate-shaped article immersed in a cleaning liquid which fills a cleaning bath having an overflow surface through which the cleaning liquid flows out, the method comprising the steps of: (a) forming streams whereby a substantial portion thereof flow; and away from a predetermined plane approximately perpendicular to the overflow surface; and (b) bringing the plate-shaped article into the cleaning liquid having the stream formed by the step (a) maintaining a state where the plate-shaped article intersects the predetermined plane and the surfaces of the plate-shaped article are approximately parallel to the formed streams on the surface of the cleaning liquid, which stream are mostly directed away from the predetermined plane on the surface of the cleaning liquid.

Another object of the present invention is to provide a cleaning bath used in the above method.

The objects of the present invention is achieved by a cleaning bath used for rinsing a plate-shaped article comprising; a bath having an overflowing surface through which a cleaning liquid flows out; and stream forming means for forming streams on a surface of the cleaning liquid which fills the bath, the formed streams being directed away from a predetermined plane alternatively perpendicular to the overflowing surface of the bath.

A further object of the present invention is to provide a cleaning equipment used in the above method.

The object of the present invention is achieved by a cleaning equipment for rinsing a plate-shaped article comprising: a cleaning bath comprising: a bath having an overflowing surface through which a cleaning liquid flows out; and stream forming means for forming streams on a surface of the cleaning liquid filling the bath, the streams being directed away from a predetermined plane alternatively perpendicular to the overflowing surface of the bath; and means for bringing the plate-shaped article into the cleaning liquid in the cleaning bath while maintaining a state where the plate-shaped article intersects the predetermined plane and where the surface of the plate-shaped article are approximately parallel to the streams formed by the stream forming means.

According to the present invention, the plate-shaped article is brought into the cleaning liquid having the surface on which the streams are mainly directed away from the predetermined plane perpendicular to the overflowing surface maintaining a state where the plate-shaped article intersects the predetermined plane and the surface of the plate-shaped article are approximately parallel to the streams mostly being directed away from the predetermined plane on the surface of the cleaning liquid. Thus, particles floating on the surface of the cleaning liquid rapidly flow out from the cleaning bath together with the stream. As a result, there are almost no particles on the surface of the plate-shaped article rinsed in such a bath.

Additional objects, features and advantages of the present invention will become apparent from the following detailed description when read in conjunction with the accompanying drawings.

DESCRIPTION OF THE DRAWINGS

FIGS. 26 and 27 are diagrams illustrating an example of a jetting mechanism of the cleaning liquid.

FIG. 28 is a diagram illustrating an operation of the jetting mechanism shown in FIGS. 19 and 20.

FIGS. 34(a) and (b) are diagram illustrating a rinsing method using the cleaning equipment shown in FIGS. 33(a) and (b).

FIG. 43 is a diagram illustrating another example of the cleaning bath.

FIG. 44 is a diagram illustrating another embodiment of the cleaning equipment.

DESCRIPTION OF THE PREFERRED EMBODIMENTS

A description will now be given, with reference to FIG. 8, of the principle embodied in a method for rinsing a plate-shaped articles according to the present invention.

Figure 8:
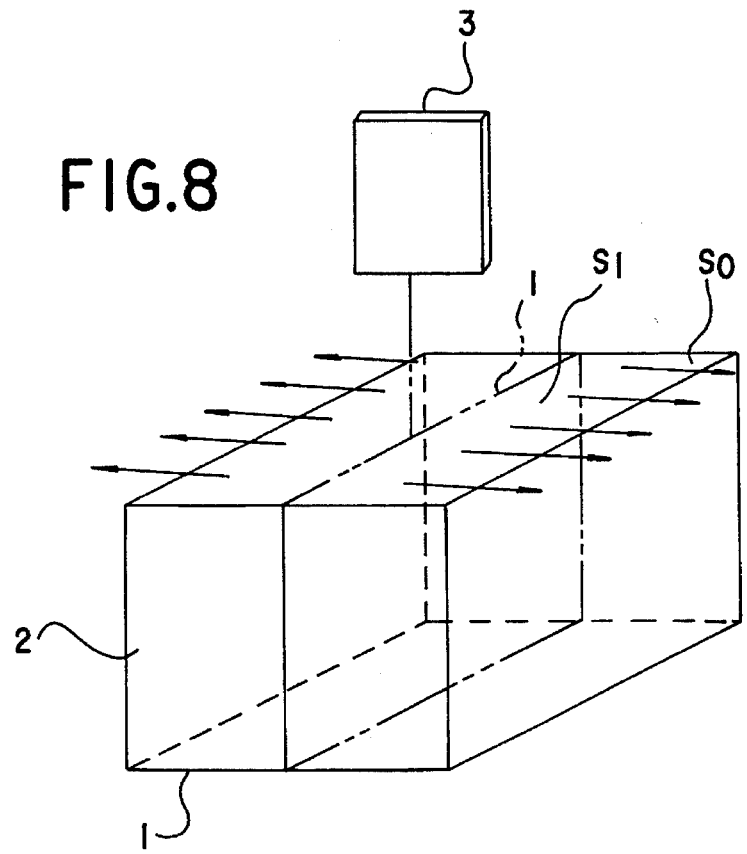
FIG. 8 is a diagram illustrating a principle of a rinsing method according to the present invention.

Referring to FIG. 8, a cleaning bath 1 is filled with cleaning liquid, and the cleaning liquid 2 flows out from the cleaning bath 1 through an overflowing surface $S_0$ positioned at an upper portion of the cleaning bath 1. When the cleaning liquid 2 flows out from the cleaning bath 1, streams are formed on the surface of the cleaning liquid 2 so as to mostly go away from a plane $S_1$ which is approximately perpendicular to the overflowing surface $S_0$. While the cleaning liquid 2 flows out from the cleaning bath 1 through the overflowing surface $S_0$, a plate-shaped article 3 is brought into the cleaning liquid 2 in a state where the plate-shaped article 3 intersects the plane $S_1$ and the surfaces of the plate-shaped article 3 are approximately parallel to the streams which a substantial portion thereof being directed away from the plane $S_1$ on the surface of the cleaning liquid 2.

For example, when the surface of the cleaning liquid 2 bulges along an intersection line 1 which is a line formed by the intersection of the overflowing surface $S_0$ and the plane $S_1$, streams mostly being directed away from the plane $S_1$ are formed on the surface of the cleaning liquid 2.

When the plate-shaped article 3 is brought into the cleaning liquid 2 in the above manner, particles on the surfaces of the plate-shaped article 3 are rinsed therefrom and flow on the streams formed on the surface of the cleaning liquid 2. The particles then flow out through the overflowing surface $S_0$ along with the cleaning liquid 2. That is, the particles rapidly flow out from the cleaning bath 1. Thus, a time period whereby the particles float and stay on the surface of the cleaning liquid 2 can be shortened.

A description will now be given of an embodiment of the present invention.

Figure 9:
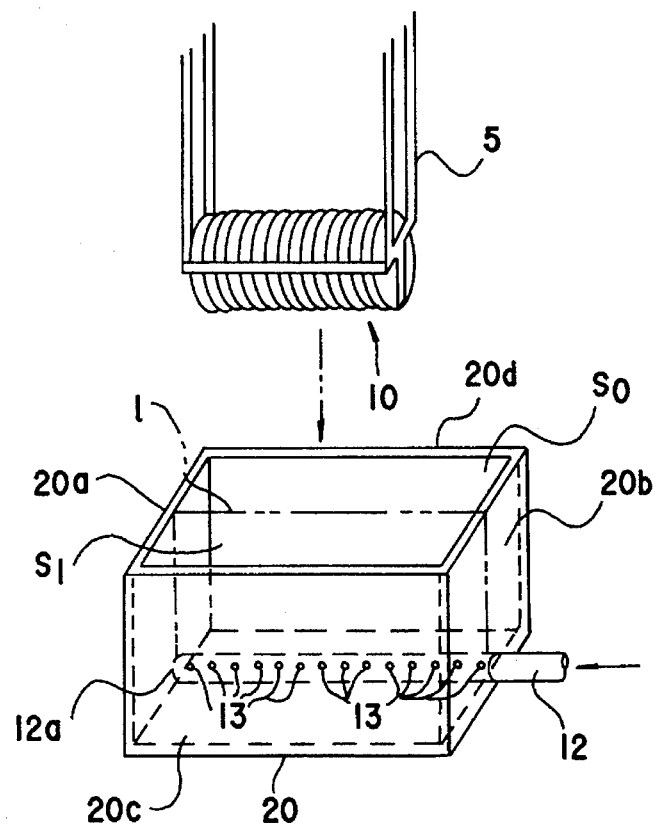
FIG. 9 is a diagram illustrating an outline of a cleaning equipment used in a rinsing method according to an embodiment of the present invention.

A cleaning equipment according to the embodiment of the present invention is basically formed as shown in FIG. 9. Referring to FIG. 9, a cleaning bath 20 has an opening surface $S_0$ at the top thereof. A bottom surface opposite to the opening surface $S_0$ is provided with a feed pipe 12. A first end 12a of the feed pipe 12 is closed and is in contact with a side wall 20a of the cleaning bath 20. The feed pipe 12 projects from a side wall 20b opposite to the side wall 20a which is in contact the first end 12a of the feed pipe 12. A second end of the feed pipe is connected to a cleaner supply mechanism (not shown). A plurality of orifices 13 are formed on the feed pipe at predetermined intervals so as to face the open surface $S_0$ of the cleaning bath 20. The feed pipe 12 is located in the middle between a front wall 20c of the cleaning bath 20 and a rear wall 20d thereof.

A plurality of semiconductor wafers 10 which are plate-shaped articles to be rinsed are supported by a robot hanger 5 so as to be arranged at predetermined intervals. The robot hanger 5 is coupled to a lift mechanism (not shown) so that the robot hanger 5 is brought into the cleaning bath 20 through the opening surface $S_0$ thereof and is lifted up from the inside to the outside of the cleaning bath 20.

Figure 10:
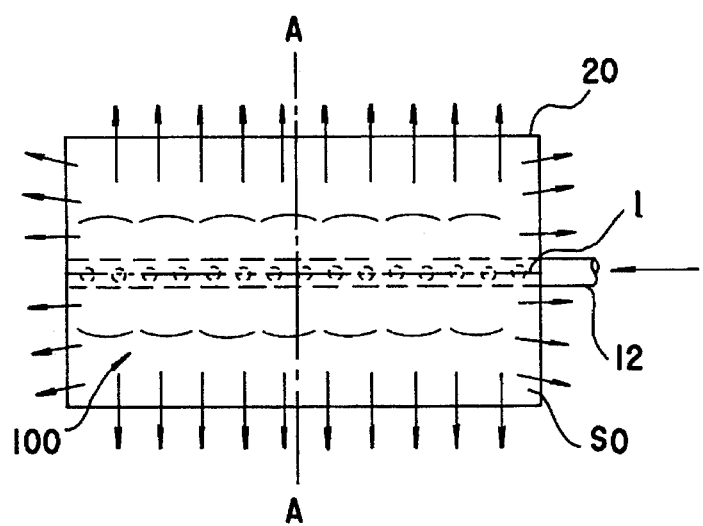
FIG. 10 is a diagram illustrating streams formed on the surface of a cleaning liquid.
Figure 11:
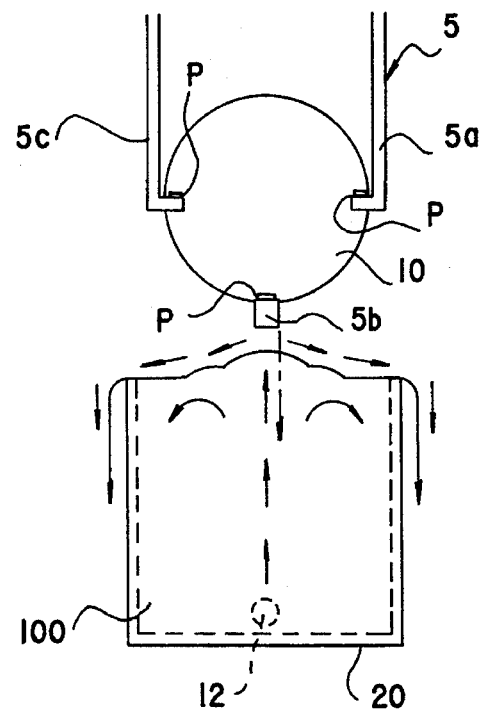
FIGS. 11, 12, 13 and 14 are diagrams illustrating a procedure for rinsing semiconductor wafers in accordance with the rinsing method according to the embodiment of the present invention.

When the cleaning liquid, such as a pure, water (hereinafter referred to as a cleaning water), is supplied from the cleaner supply mechanism to the feed pipe 12, the cleaning water is jetted from the orifices 13. After the cleaning bath 20 is filled with the cleaning water, the cleaning water 100 flows out from the cleaning bath 20 through the opening surface $S_0$ (an overflowing surface) as shown in FIG. 10. In the cleaning water 100, streams directed upward from the respective orifices 13 of the feed pipe 12 are formed. The jetting pressure of the cleaning water 100 jetted from the orifices 13 is controlled by the cleaner supply mechanism so that a part of the surface of the cleaning water 100 opposite to the feed pipe 12 bulges as shown in FIG. 11. That is, the surface of the cleaning water 100 bulges along an intersection line 1 which is a line formed by the intersection of the opening surface $S_0$ and a plane $S_1$ including the feed pipe 12 and being perpendicular to the opening surface $S_0$. The diameters of the orifices 13 are adjusted so that the jetting pressures of the cleaning water 100 at all the orifices 13 are uniform. When the surface of the cleaning water 100 bulges along the intersection line 1, due to the bulging of the surface of the cleaning water 100, streams being directed away from the plane $S_1$ are formed on the surface of the cleaning water 100 as shown in FIGS. 10 and 11.

Figure 12:
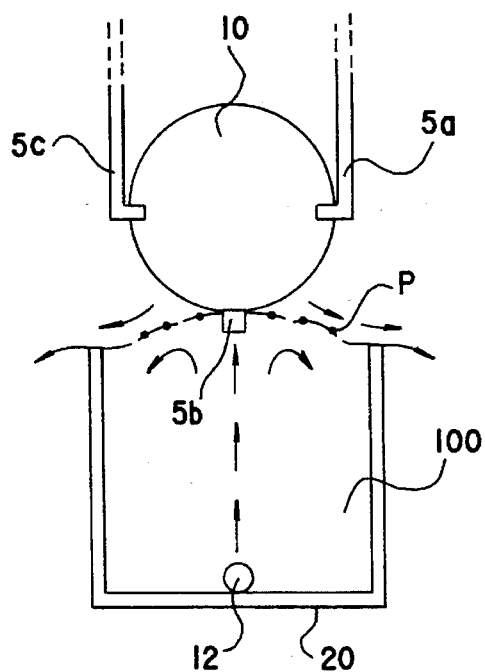
Figure 13:
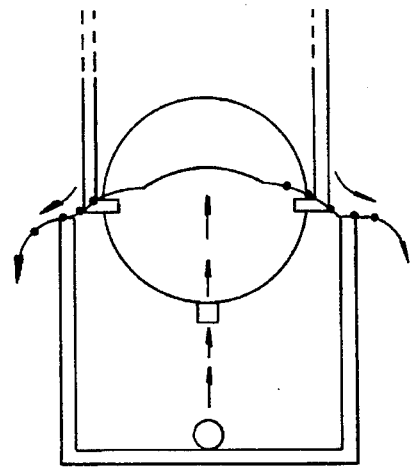
Figure 14:
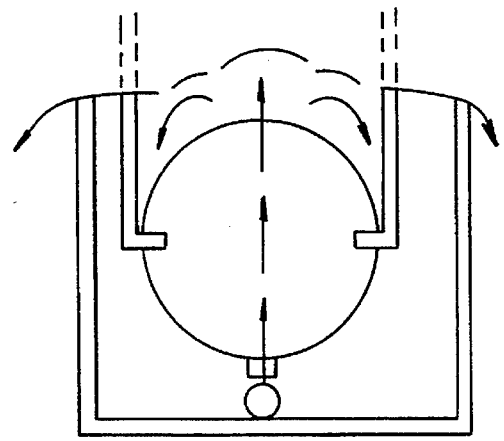

In the above-described state, the semiconductor wafers 10 supported by the robot hanger 5 are gradually brought into the cleaning water 100 as shown in FIGS. 12 and 13. Here, each of the semiconductor wafers 10 is brought into the cleaning water 100 while maintaining a state where a lower edge supported by the hanger arm 5b passes through the moving up part of the cleaning water 100 and the surfaces of each of the semiconductor wafers 10 are approximately parallel to the streams having a substantial portion thereof; and directed away from the plane $S_1$. At this time, first, the lower edge of each of the semiconductor wafers 10 which edge is supported by the hanger arm 5b is brought into contact with the surface of the moving up part of the cleaning water 100. Particles P generated by the friction of the hanger arm 5b and each of the semiconductor wafers 10 thus float and flow on the surface of the cleaning water 100 with the streams as shown in FIG. 11. That is, the particles P move away from the hanger arm 5b in a direction approximately parallel to the surfaces of each of the semiconductor wafers 10 and flow out from the cleaning bath 20 with the cleaning water 100. The semiconductor wafers 10 further sink into the cleaning water 100, and side edges of each of the semiconductor wafers 10 which edges are supported by the hanger arms 5a and 5c reach the surface of the cleaning water 100. Particles P generated by the friction of the hanger arms 5a and 5c and the semiconductor wafers 10 flow with the streams formed on the surface of the cleaning water 100 and flow out from the cleaning bath 20, in the same manner as described above. The semiconductor wafers 10 are then completely immersed in the cleaning water 100 as shown in FIG. 14. In this state, chemicals and other particles remaining on the surfaces of the semiconductor wafers 10 are rinsed from the semiconductor wafers 10 for a predetermined period of time. After the rinsing of the semiconductor wafers 10 is completed, the semiconductor wafers 10 are lifted up by the robot hanger 5 from the inside of the cleaning bath 20 to the outside thereof. At this time, there are almost no particles P floating on the surface of the cleaning water 100. Thus, when the semiconductor wafers 10 are lifted up, there are almost no particles adhering to the surfaces of each of the semiconductor wafers 10.

When the semiconductor wafers 10 are brought into and immersed in the cleaning water 100 in the above manner, the chemicals, other dust, impurities and the like are also rinsed from the surfaces of each of the semiconductor wafers 10. These undesired particles flow out of the cleaning bath 20 with the streams formed on the surface of the cleaning water 100.

According to the above embodiment, while the semiconductor wafers 10 are being brought into the cleaning water 100, the particles P rinsed from the surfaces of each of the semiconductor wafers 10 flow the streams on the surface of the cleaning water 100 with so as to mostly be directed away from the semiconductor wafers 10 in directions roughly parallel to the streams. The particles then flow out from the cleaning bath 20 together with the streams formed on the surface of the cleaning water 100. As a result, the number of particles floating on the surface of the cleaning water 100 drastically decreases and there are almost no particles adhered to the surfaces of each of the semiconductor wafers 10 lifted up.

In the above rinsing method of the semiconductor wafers 10, it is necessary to stably maintain a state where a part of the surface of the cleaning water 100 bulges so as to form uniform streams on the surface of the cleaning water 100. For this reason, it is preferred that the cleaning water 100 be jetted from the articles 13 of the feed pipe 12 upward so as to reach the surface of the cleaning water 100 with extension (to diffuse so as to travel not in a straight state) as small as possible.

Examples of a mechanism for jetting the cleaning water upward with extension as small as possible will be described below.

Figure 15:
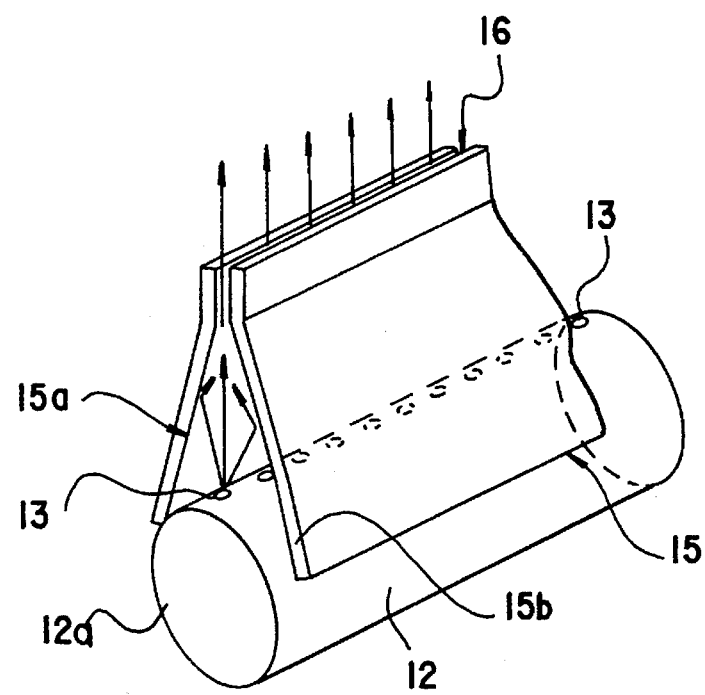
FIG. 15 is a perspective view illustrating a first example of a jetting mechanism for jetting the cleaning liquid.

A first example of the mechanism is shown in FIG. 15. Referring to FIG. 15, a straightening unit 15 is mounted on the feed pipe 12 so as to cover the orifices 13. The straightening unit 15 is formed of a first straightening plate 15a and a second straightening plate 15b. The space between the first and second straightening plates 15a and 15b decreases in accordance with a distance from the orifices 13 of the feed pipe 12. Tip end portions of the first and second straightening plates 15a and 15b are parallel to each other so that a slit 16 is formed at the tip end of the straightening unit 15.

In the above described structural arrangement where the straightening unit 15 is provided on the feed pipe 12, even if the cleaning water 100 is jetted from the orifices 13 with extension, the cleaning water 100 is guided upward by the first and second straightening plates 15a and 15b. As a result, the cleaning water 100 is jetted in a straight fashion from the slit 16 of the straightening unit 15 toward the surface of the cleaning water 100. In this case, as the streams of the cleaning water 100 jetted from the orifices 13 is regulated by the slit 16 of the straightening unit 16, the cleaning water 100 jetted from the slit 16 reaches the surface of the cleaning water 100 without extension. Thus, it is possible to maintain, in a stable manner, the state whereby a part of the surface opposite to the feed pipe 12 bulges.

Figure 16A:
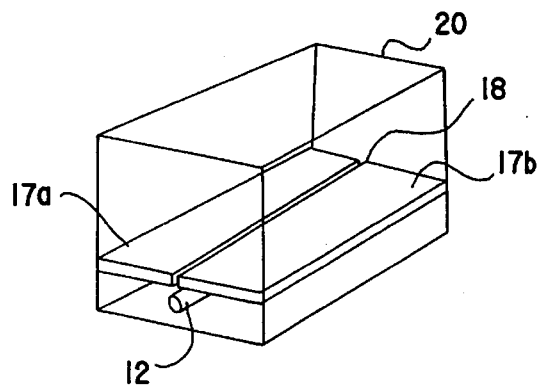
FIGS. 16(a), (b) and (c) are diagrams illustrating a second example of a jetting mechanism for jetting the cleaning liquid.
Figure 16B:
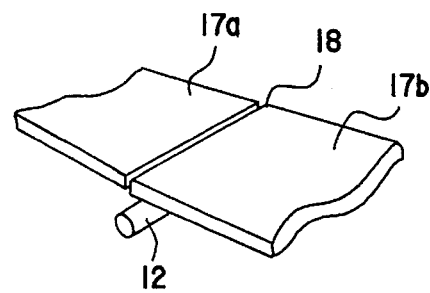
Figure 16C:
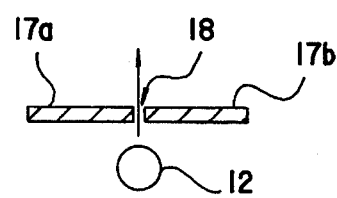

A second example of the mechanism is shown in FIGS. 16(*a*), (*b*) and (*c*). Referring to FIGS. 16(*a*), (*b*) and (*c*), plates 17a and 17b are provided above the feed pipe 12 so that a slit 18 between the plates 17a and 17b faces the feed pipe 12. The plates 17a and 17b are fixed on walls of the cleaning bath 20 so that the distance between the feed pipe 12 and the slit 18 is maintained at a predetermined value. In the second example, the cleaning water 100 jetted from the orifices 13 of the feed pipe 12 is regulated by the slit 18. As a result, the cleaning water 100 passes through the slit 18 and reaches the surface of the cleaning water 100 without extension in the same manner as in the first example.

Figure 17A:
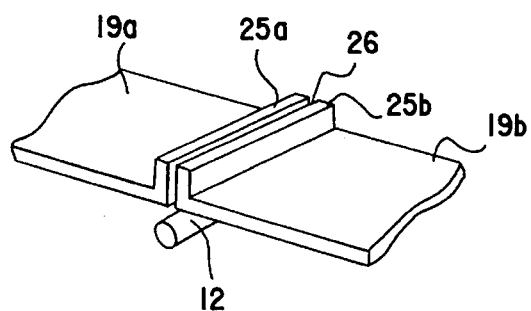
FIGS. 17(a) and (b) are diagrams illustrating a third example of a jetting mechanism for jetting the cleaning liquid.
Figure 17B:
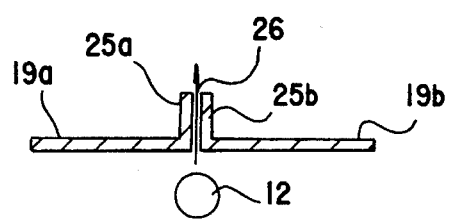

A third example of the mechanism is shown in FIGS. 17(*a*) and (*b*). Referring to FIGS. 17(*a*) and (*b*), plates 19a and 19b are provided above the feed pipe 12 in the same manner as the plates 17a and 17b in the above second example. Straightening plates 25a and 25b are mounted on edges of the plates 19a and 19b which edges face each other.

The straightening plates 25a and 25b are arranged parallel to each other so that a slit 26 is formed between the straightening plates 25a and 25b. The slit 26 faces the feed pipe 12. In the third example, due to the straightening plates 25a and 25b, the extension of the cleaning water 100 ejected from the slit 26 is smaller than the extension thereof in the above second example shown in FIGS. 16(*a*), (*b*) and (*c*).

Figure 18A:
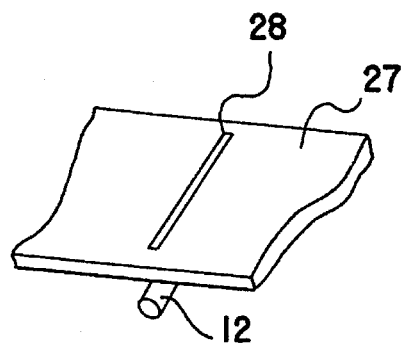
FIGS. 18(a) and (b) are diagrams illustrating a fourth example of a jetting mechanism for jetting the cleaning liquid.
Figure 18B:
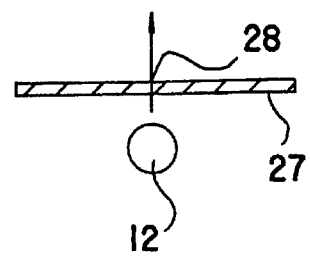

A fourth example of the mechanism is shown in FIGS. 18(*a*) and (*b*). Referring to FIGS. 18(*a*) and (*b*), a plate 27 is provided above the feed pipe 12. A slit 28 is formed on the plate 27 so as to face the feed pipe 12. The plate 27 is fixed on the walls of the cleaning bath 20. In the fourth example, the cleaning water 100 jetted from the slit 28 reaches the surface of the cleaning water 100 without extension in the same manner as in the second example.

Figure 19A:
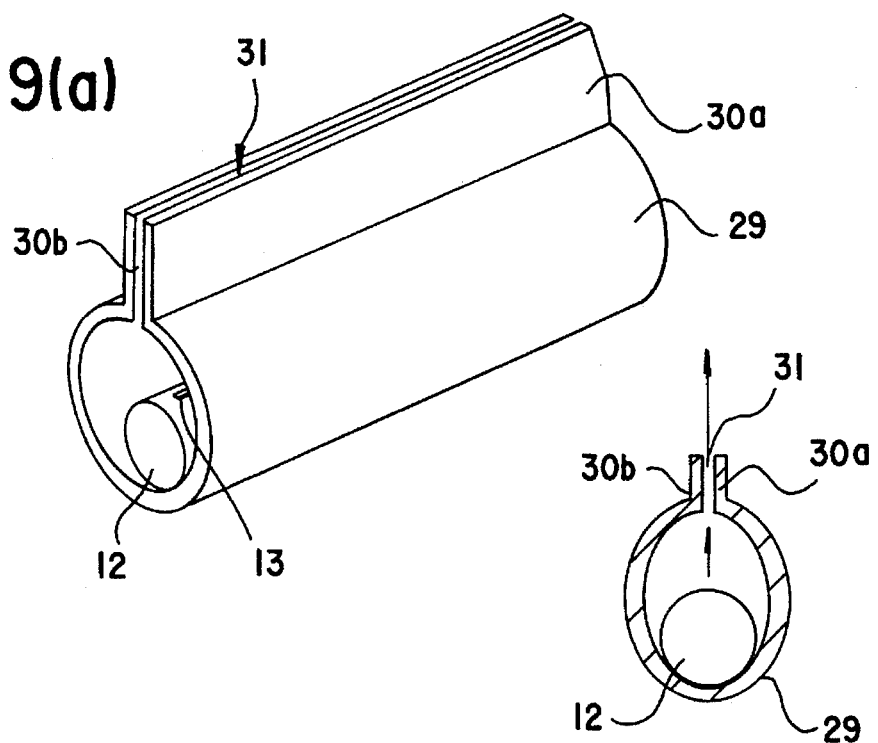
FIGS. 19(a) and (b) are diagrams illustrating a fifth example of a jetting mechanism for jetting the cleaning liquid.
Figure 19B:
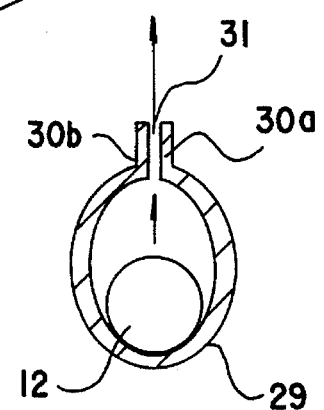

A fifth example of the mechanism is shown in FIGS. 19(*a*) and (*b*). Referring to FIGS. 19(*a*) and (*b*), the feed pipe 12 is housed in a cylindrical straightening unit 29. Plates 30a and 30b are mounted on an upper portion of the cylindrical straightening unit 29 so as to be parallel to each other. A slit 31 is formed between the plates 30a and 30b. The slit 31 faces the orifices 13 of the feed pipe 12. In the fifth example, the cleaning water 100 jetted from the orifices 13 is guided toward the slit 31 by the inner surface of a wall of the straightening unit 29 and is uniformly jetted from the slit 31 toward the surface of the cleaning water 100.

The first end 12a of the feed pipe 12 is closed. Thus, in a case where diameters of the orifices 13 are the same, even if the cleaning water 100 is supplied to the feed pipe 12 at a constant pressure, the closer to the first end 12a, the bigger the jetting pressure of the cleaning water 100 that is ejected from the orifices 13. Thus, in the above embodiment, the diameters of the orifices 13 of the feed pipe 12 are adjusted so that the uniform jetting pressure of the cleaning water 13 is obtained. However, in a case where the diameters of many orifices 13 differ from each other, the amount of time required for producing the feed pipe 12 increases.

A description will now be given, with reference to FIGS. 20, 21 and 22, of examples of a jetting mechanism for eliminating the above-described problem.

Figure 20:
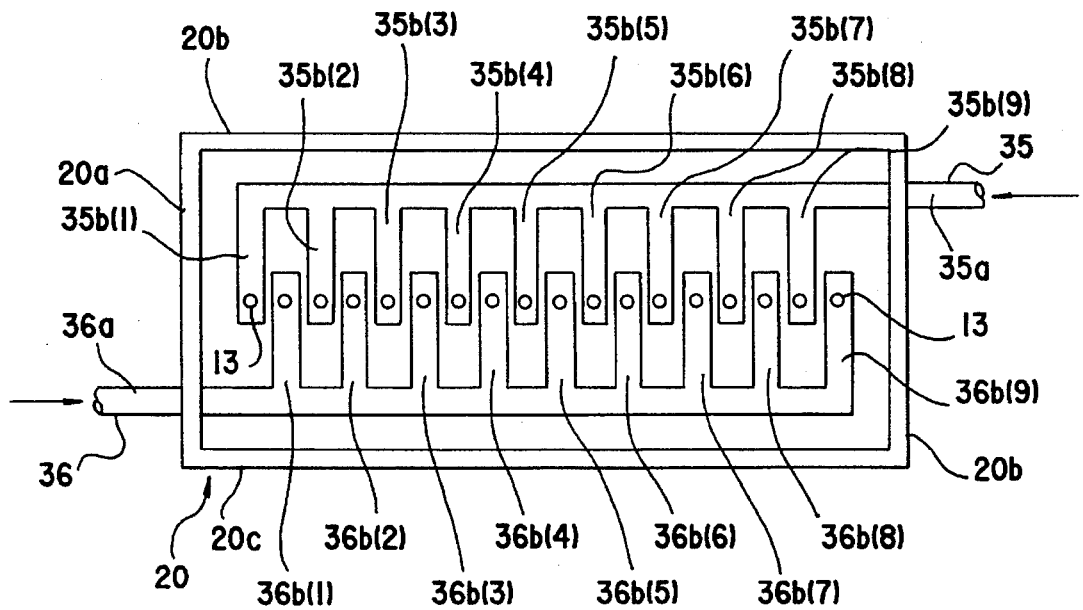
FIGS. 20 and 21 are diagrams illustrating other embodiment of the cleaning bath according to the present invention.

A first example of the jetting mechanism is shown in FIG. 20. Referring to FIG. 20, a first feed pipe 35 and a second feed pipe 36 are provided on the bottom surface of the cleaning bath 20. The first feed pipe 36 passes through the side wall 20b of the cleaning bath 20 and connected to the cleaner supply mechanism. The second feed pipe 36 passes through the side wall 20a opposite to the side wall 20b and is connected to the cleaner supply mechanism. The first feed pipe 35 is formed of a main pipe 35a and a plurality of branch pipes 35b(1)–35b(9) (in this case, nine branch pipes are provided). The main pipe 35a is arranged parallel to the rear wall 20d of the cleaning bath 20. The branch pipes 35b(1)–35b(9) connected to the main pipe 35a are arranged at predetermined intervals and extend in a direction perpendicular to the main pipe 35a and parallel to the bottom surface of the cleaning bath 20. Ends of the respective branch pipes 35b(1)–35b(9) are closed. Orifices 13 are formed on the branch pipes 35b(1)–35b(9) at positions near to the ends thereof. The second feed pipe 36 is formed of a main pipe 36a and a plurality of branch pipes 36b(1)–36b(9) in the same manner as the first feed pipe 35. The main pipe 36b of the second feed pipe 36 is arranged parallel to the front surface 20c of the cleaning bath 20. The branch pipes 36b(1)–36b(9) are arranged at predetermined intervals and connected to the main pipe 36a in the same manner as the branch pipes 35b(1)–35b(9) of the first feed pipe 35. Ends of the branch pipes 36b(1)–36b(9) are also closed, and orifices 13 are formed on the branch pipes 36b(1)–36b(9) at positions near to the ends thereof. The branch pipes 35b(1)–35b(9) of the first feed pipe 35 and the branch pipes 36b(1)–36b(9) of the second feed pipe 36 are alternately arranged so that the orifices 13 on the branch pipes 35b(1)–35b(9) and 36b(1)–36b(9) are on a line parallel to both the main pipes 35a and 36a.

According to the above jetting mechanism, all the orifices 13 are formed at positions near to the ends of the branch pipes 35b(1)–35b(9) and 36b(1)–36b(9) and far from the main pipes 35a and 36a. Thus, pressures in branch pipes hardly affect each other, so that jetting pressures of the cleaning water 100 jetted from the orifices 13 do not much differ from each other. In addition, the main pipes 35a and 36a of the first and second feed pipes 35 and 36 are provided with the cleaning water in opposite directions. Thus, even if the jetting pressure varies in accordance with positions of the orifices 13, the pressure distribution in accordance with positions on the first feed pipe 35 is opposite to that in accordance with positions on the second feed pipe 36. As the branch pipes 35b(1)–35b(9) of the first feed pipe 35 and the branch pipes 36(1)–36(9) of the second feed pipe 36 are alternately arranged, the pressure distributions of the first and second feed pipes 35 and 36 compensate for each other. As a result, the pressure of streams flowing toward the surface of the cleaning water 100 is almost uniform.

Figure 21:
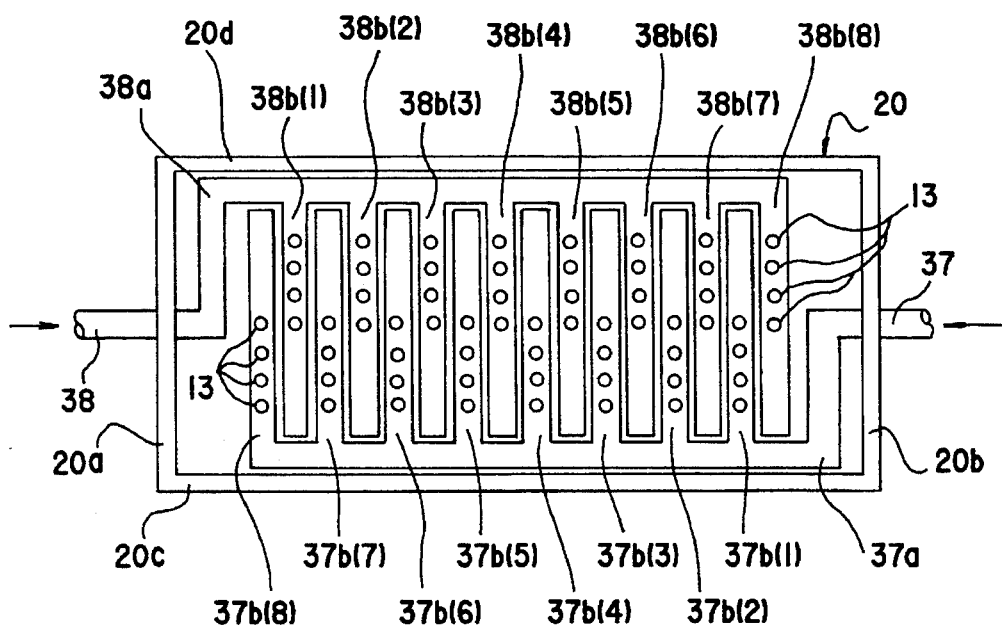
Figure 22:
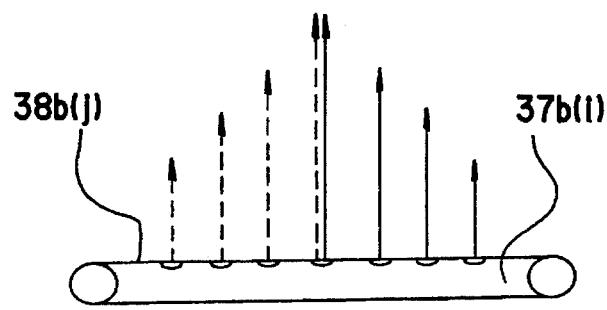
FIG. 22 is a diagram illustrating a jetting pressure distribution of the cleaning liquid in the cleaning bath shown in FIG. 21.

A second example of the jetting mechanism is shown in FIG. 21. Referring to FIG. 21, a first feed pipe 37 formed of a main pipe 37a and a plurality of branch pipes 37b(1)–37b(7) and a second feed pipe 38 formed of a main pipe 38b and a plurality of branch pipes 38b(1)–38b(7) are provided on the bottom surface of the cleaning bath 20 in almost the same as those in the above first example. The branch pipes 37b(1)–37b(7) of the first feed pipe 37 and the branch pipes 38b(1)–38b(7) of the second feed pipe 38 are alternately arranged in the same manner as those in the first example. Ends of the branch pipes 37b(1)–37b(7) and 38b(1)–38b(7) are closed. Orifices 13 are formed on each of the branch pipes 37b(1)–137b(7) and 38b(1)–38b(7) so as to be arranged from a position in the middle between the front and rear walls 20c and 20d toward the main pipes 37a and 38a. The orifices 13 formed at the farthest position from the main pipes 37a and 38a are arranged on a line parallel to both the main pipe 37a and 38a.

In the second example, the same advantages as in the first example are obtained and the following advantages are also obtained.

The orifices 13 positioned on the line in the middle between the front and rear walls 20c and 20d of the cleaning bath 20 are closest to the ends of the branch pipes 37b(1)–37b(7) and 38b(1)–38b(7). Thus, the largest jetting pressures are obtained at the orifices 13 positioned on the line in the middle between the front and rear walls 20c and 20d. In each of the branch pipes 37b(1)–37b(7) and 38b(1)–38b(7), the jetting pressure of the cleaning water 100 jetted from the orifice 13 far from the position in the middle between the front and rear walls 20c and 20d is small, as shown in FIG. 22. According to the pressure distribution as shown in FIG. 22, it is possible to cause the surface of the cleaning water 100 in the middle between the front and rear walls 20c and 20d of the cleaning bath 20 stably move up.

A description will now be given, with reference to FIGS. 23, 24 and 25, of another embodiment of the cleaning bath of the semiconductor wafers.

Figure 23:
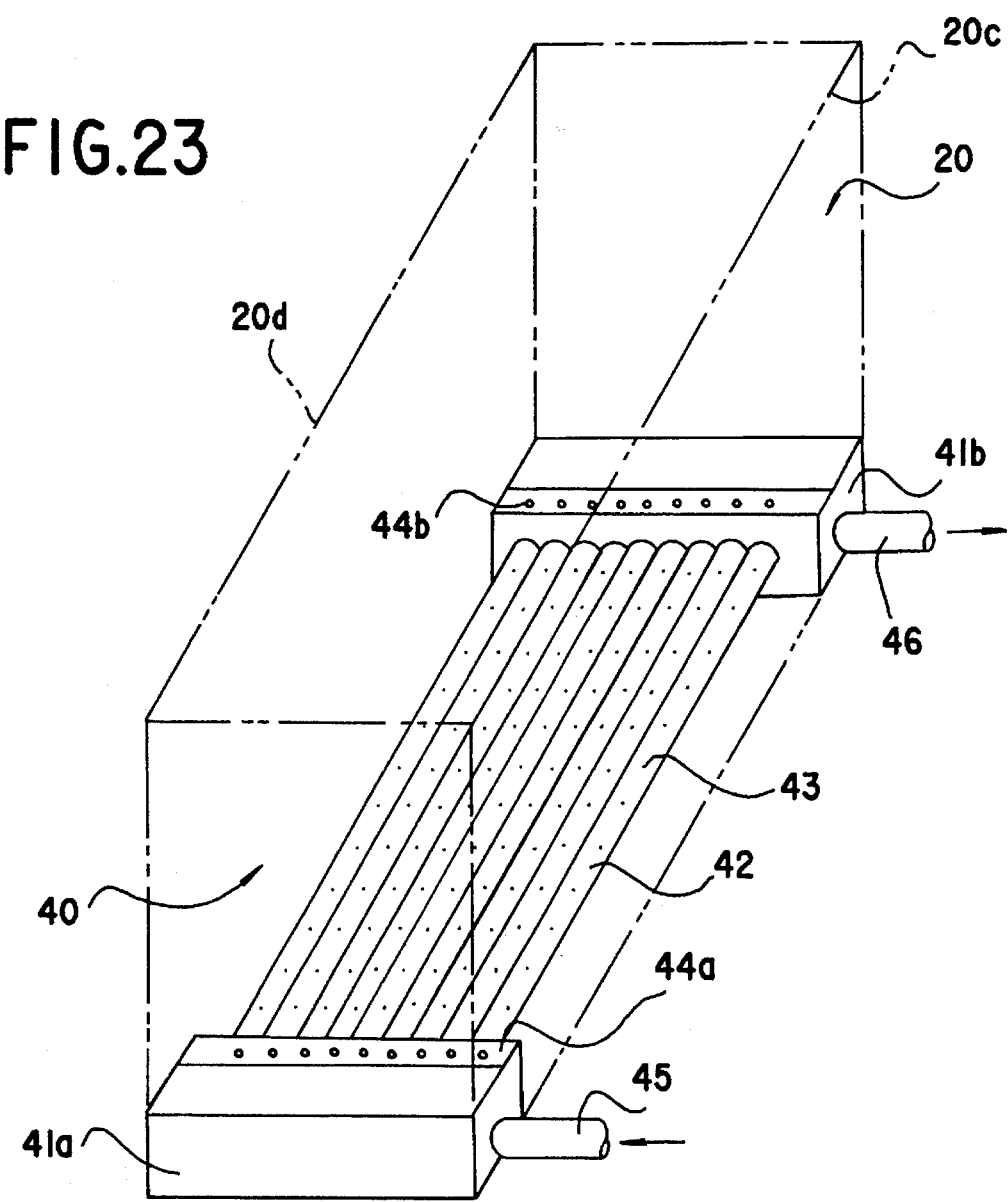
FIG. 23 is a diagram illustrating another embodiment of the cleaning bath according to the present invention.

Referring to FIG. 23, the bottom surface of the cleaning bath 20 is provided with a jetting unit 40 for jetting the cleaning water. The jetting unit 40 comprises an inlet block 41a, an outlet block 41b and a plurality of feed pipes 41 provided between the inlet block 41a and the outlet block 41b and connected thereto. Each of the feed pipes 42 is arranged in parallel to the front and rear walls 20c and 20d of the cleaning bath 20. Orifices 43 are formed on each of the feed pipes 42 so as to be arranged at predetermined intervals. The inlet block 41a is connected with a pipe 45 and the cleaning water having a predetermined pressure is supplied from the cleaner supply mechanism (not shown) to the inlet block 41a via the pipe 45. The inlet block 41a is connected to each of the feed pipes 42 via a control valve. The inlet block 41a is provided with control screws 44a each of which is used for controlling a corresponding control valve. The outlet block 41b and each of the feed pipes 42 are also connected to each other via a control valve. The outlet block 41b is provided with control screws 44b each of which is used for controlling a corresponding control valve. The outlet block 41b is connected to a pipe 46. The cleaning water ejected from the outlet block 41b is returned to the cleaner supply mechanism via the pipe 46.

Figure 24:
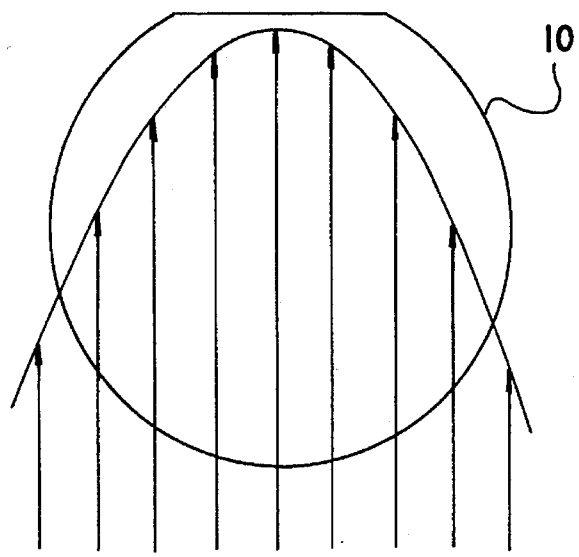
FIGS. 24 and 25 are diagram illustrating jetting pressure distributions of the cleaning liquid in the cleaning bath shown in FIG. 16.
Figure 25:
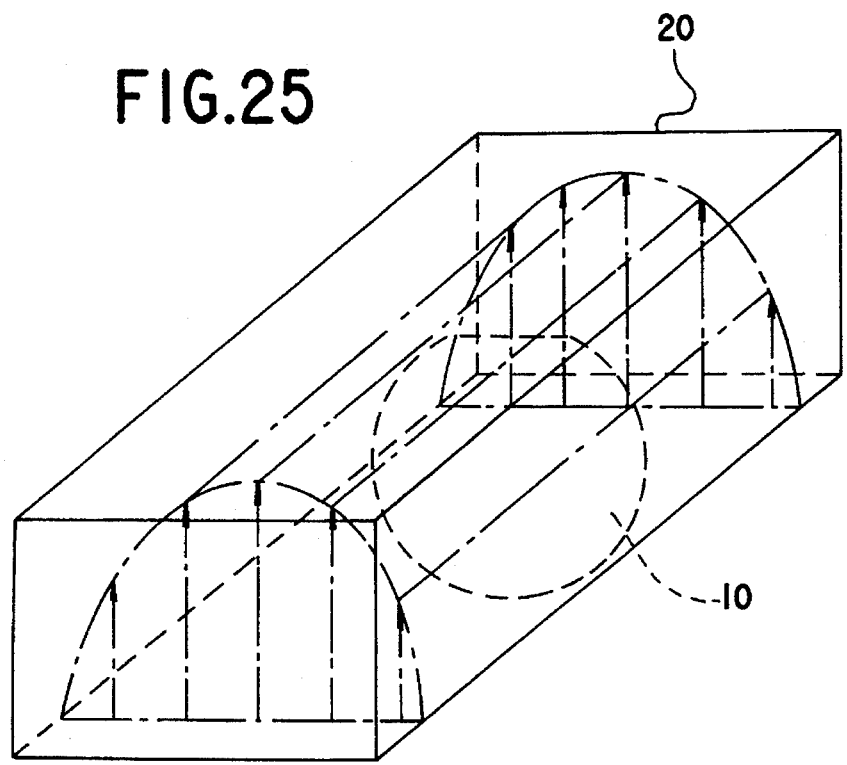

In the cleaning bath 20 provided with the above jetting unit 40, the control screws 44a and 44b provided on the inlet block 41a and the outlet block 41b so that jetting pressure distribution within a plane perpendicular to a direction in which the feed pipes 42 extend becomes a normal distribution as shown in FIG. 24. That is, the cleaning water is jetted from a feed pipe positioned in the middle of the feed pipes 42 with the largest jetting pressure, and the further distance from the feed pipe positioned in the middle of the feed pipes 42, the smaller the jetting pressure of the cleaning liquid jetted by the feed pipes 42. The diameters of the orifices 13 of each of the feed pipes 42 are adjusted so that the jetting pressures are uniform in a direction parallel to each of the feed pipes 42. As a result, a jetting pressure distribution is formed as shown in FIG. 25 in the cleaning bath 20. Due to the jetting pressure distribution as shown in FIG. 25, the surface of the cleaning water 100 in the cleaning bath 20 bulges as shown in FIGS. 11 and 12. Thus, stable upward moving streams near the front and rear walls 20c and 20d are formed on the surface of the cleaning water in the cleaning bath 20.

The semiconductor wafers 10 are brought into the cleaning water having the above jetting pressure distribution in a state where the surfaces of each of the semiconductor wafers 10 is perpendicular to a direction in which the feed pipes 42 extend (see FIGS. 11, 12, 13 and 14).

FIG. 26 shows another example of the jetting mechanism of the cleaning liquid.

Referring to FIG. 26, a first feed pipe unit 70 have a space formed in the middle thereof. A second feed pipe unit 72 is provided in the space of the first feed pipe unit 70. The first and second feed pipe units 70 and 72 are provided over the bottom surface of a cleaning bath. The first feed pipe unit 70 has a plurality of pipes 70a connected to each other in parallel. The second feed pipe unit 72 has three pipes 72a connected to each other in parallel. A plurality of orifices 71 and 73 are formed on each of the pipes 70a and 72a so as to be arranged at predetermined intervals. Each of the pipes 72a of the second pipe unit 72 is provided with a straightening device 74. The straightening device 74 has an opening surface 76 facing the orifices 73 arranged in a line on each pipe 72a as shown in FIGS. 27(a) and (b). Supporting projections 75 are formed on both ends of the straightening device 74. The supporting projections 75 are in contact with each pipe 72a and slits 78 are formed between both the side surface of the straightening device 74 and the surface of each pipe 72a. The height (a) of the straightening device 74 is about few tens millimeters and the with (b) thereof is about a few millimeters.

In the above jetting mechanism, the cleaning liquid jetted from the orifices 73 of each pipe 72a is guided by the straightening device 74 and is jetted from the opening surface 76 upward. Due to the cleaning liquid jetted from the opening surface 76 of the straightening device 74, the cleaning liquid in the cleaning bath is pulled into the straightening device 74 through the slits 78 formed on the side surfaces thereof, as shown in FIG. 28. As a result, the jetting force of the cleaning liquid jetted from the straightening device is amplified. Thus, the cleaning liquid jetted from each pipe 72a is propelled upward so as to stably make the surface thereof bulge.

In a state where the cleaning liquid is supplied to the second feed pipe unit 72 so that the surface of the cleaning liquid bulges as shown in FIG. 11, the semiconductor wafers 10 are gradually carried into the cleaning liquid. After the semiconductor wafers are completely immersed in the cleaning liquid, the cleaning liquid is supplied to the first feed pipe 70 and the semiconductor wafers are rinsed. When the cleaning liquid is supplied to the first feed pipe 70, the supply of the cleaning liquid to the second feed pipe 72 may be stopped.

A description will now be given of embodiments of the cleaning equipment.

Figure 29:
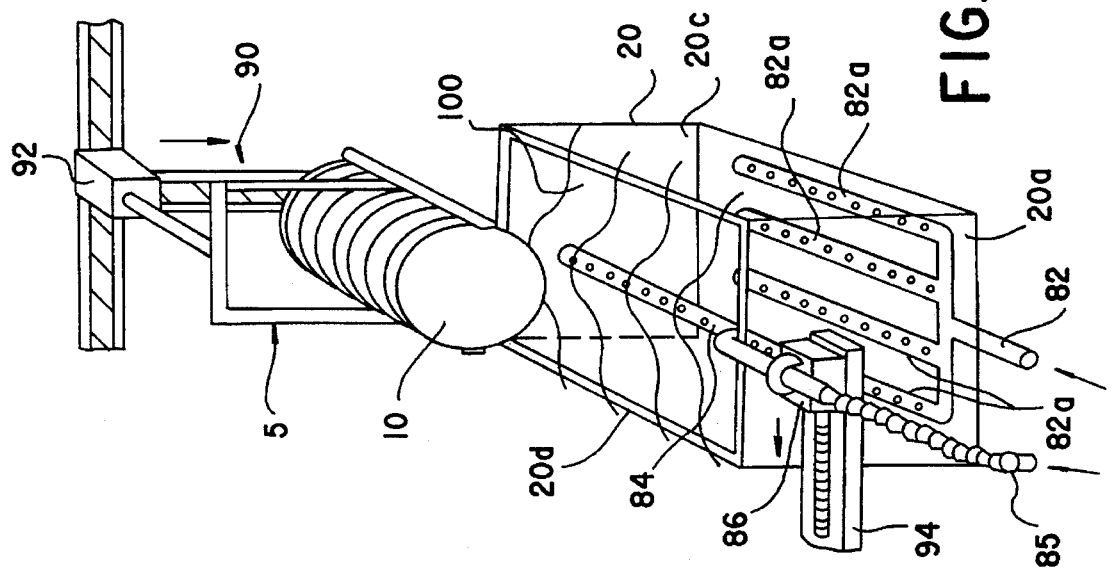

FIG. 29 shows the cleaning equipment according to a first embodiment of the present invention. In reference to FIG. 29, a feed pipe unit 80 having a plurality of pipes 82a is provided on the bottom surface of the cleaning bath 20. The cleaning bath 20 is provided with a moving feed pipe 83 positioned, in an initial state, above the feed pipe unit 82 and in the middle between the front and rear walls 20c and 20d of the cleaning bath 20. The moving feed pipe 84 crosses over the side wall 20a and is fixed on a carriage 86. The carriage 86 is mounted with a motor, and can be moved on a rail 94 by the motor. The rail 94 extends in a horizontal direction along the side wall 20c. The feed pipe unit 82 is connected to the cleaner supply mechanism and the moving feed pipe 84 is also connected to the cleaner supply mechanism via a flexible hose 85. A plurality of orifices arranged in a line at predetermined intervals are formed on each of the pipes 82a and 84. The hanger 5 supporting a plurality of semiconductor wafers in one lot is fixed on a carriage 92. The carriage 92 is mounted with a motor and can be moved by the motor on a rail 90 extending in a horizontal direction and a vertical direction. The motor mounted on the carriage 86 on which the moving feed pipe 84 and the motor mounted on the carriage 92 on which the hanger 5 is fixed are controlled so as to be operated in synchronism with each other.

The semiconductor wafers are rinsed using the above cleaning equipment in the following manner.

Figure 30:
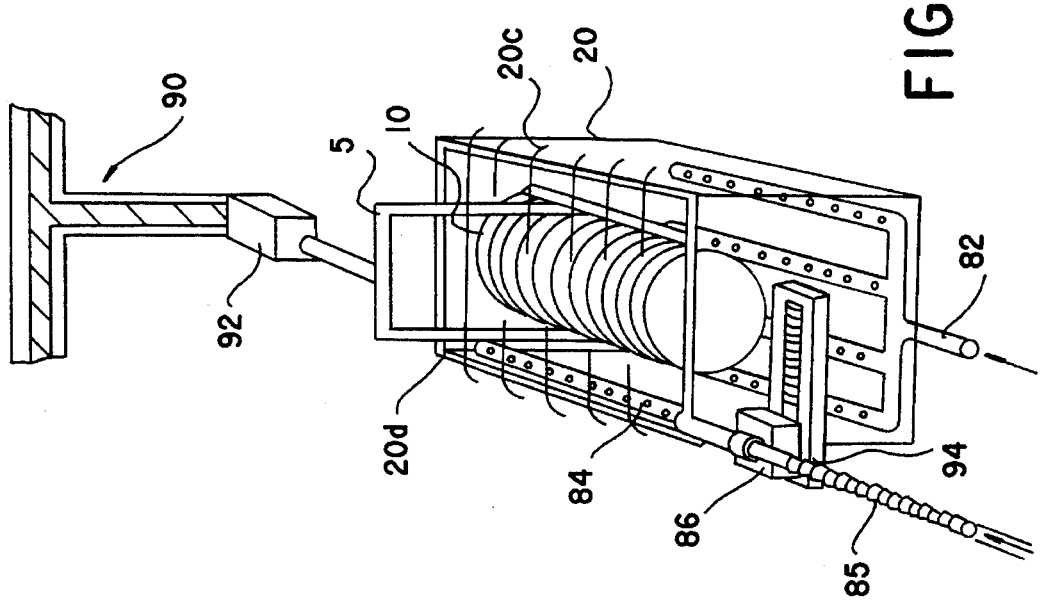
FIGS. 29 and 30 are diagram illustrating an example of the cleaning equipment.
Figures 31A, 31B, 31C:
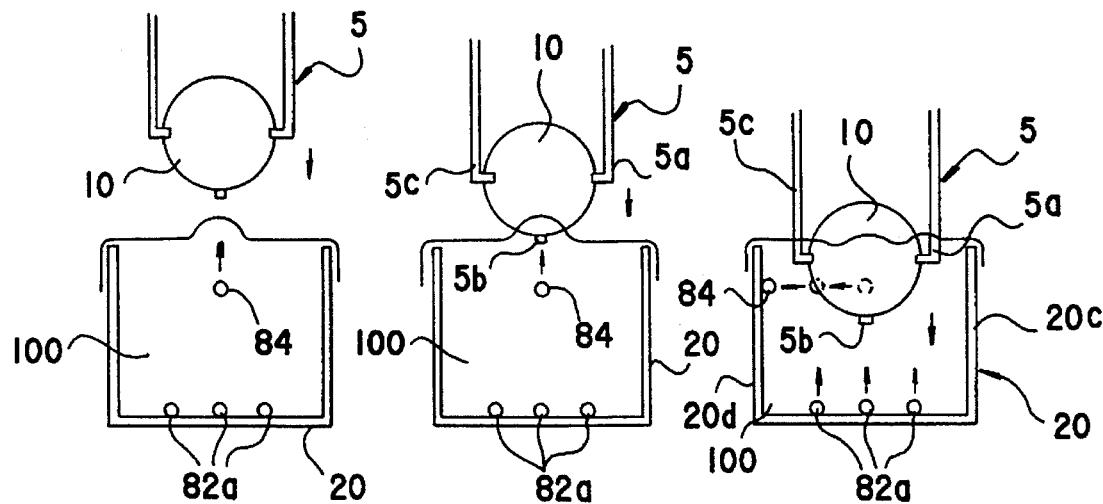
FIGS. 31(a), (b) and (c) are diagrams illustrating a rinsing method using the cleaning equipment shown in FIGS. 29 and 30.

First, the cleaning bath 20 is filled with the cleaning liquid 100. The cleaning liquid is then jetted from the orifices of the moving feed pipe 84 positioned at the initial position as shown in FIG. 29. Due to the jetting of the cleaning liquid from the moving feed pipe 84, the middle portion of the surface of the cleaning liquid 100 bulges along a direction in which the moving feed pipe 84 extends (see FIG. 31(a)). At this time, streams are formed on the surface of the cleaning liquid 100 so as to be directed away from the bulging middle portion of the surface of the cleaning liquid 100 to both the front and rear walls 20c and 20d. In this state, the carriage 92 on which the hanger 5 is fixed goes down on the rail 90 extending in the vertical direction, so that the semiconductor wafers 10 supported by the hanger 5 is carried into the cleaning liquid 100 (see FIG. 31(b)). In a process until the hanger arms 5a and 5c supporting the side edges of the semiconductor wafers 10 are carried into the cleaning liquid 100 after the hanger arm 5b supporting the lower edges of the semiconductor wafers 10 is carried into the cleaning liquid 100, particles on the hanger arms 5a, 5b and 5c flow out from the cleaning bath with the stream formed on the surface of the cleaning liquid, in the same manner as described above. After this, the cleaning liquid 100 starts being jetted from the orifices of the feed pipe unit 82 and the supply of the cleaning liquid 100 to the moving feed pipe 84 is stopped. The carriage 86 on which the moving feed pipe 84 is fixed moves on the rail 94 in synchronism with the moving of the carriage 92, on which the hanger 5 is fixed, downward. That is, while the semiconductor wafers 10 is going down, the moving pipe 84 moves toward the rear wall 20d of the cleaning bath 20 (see FIG. 31(c)). When the carriage 92 on which the hanger 5 further goes down and reaches the bottom position, the semiconductor wafers 10 are completely immersed in the cleaning liquid 100 as shown in FIG. 30, and are rinsed.

In the above cleaning equipment, until the particles are removed from the semiconductor wafers 10, the cleaning liquid 100 is jetted from the moving feed pipe 84 above the feed pipe unit 82. That is, in the state whereby the surface of the cleaning liquid bulges in a stable manner, the particles are removed from the semiconductor wafers 10. Thus, the particles removed from the semiconductor wafers 10 immediately flow out from the cleaning bath 20 with the stream formed on the surface of the cleaning liquid 100.

Figures 32A, 32B:
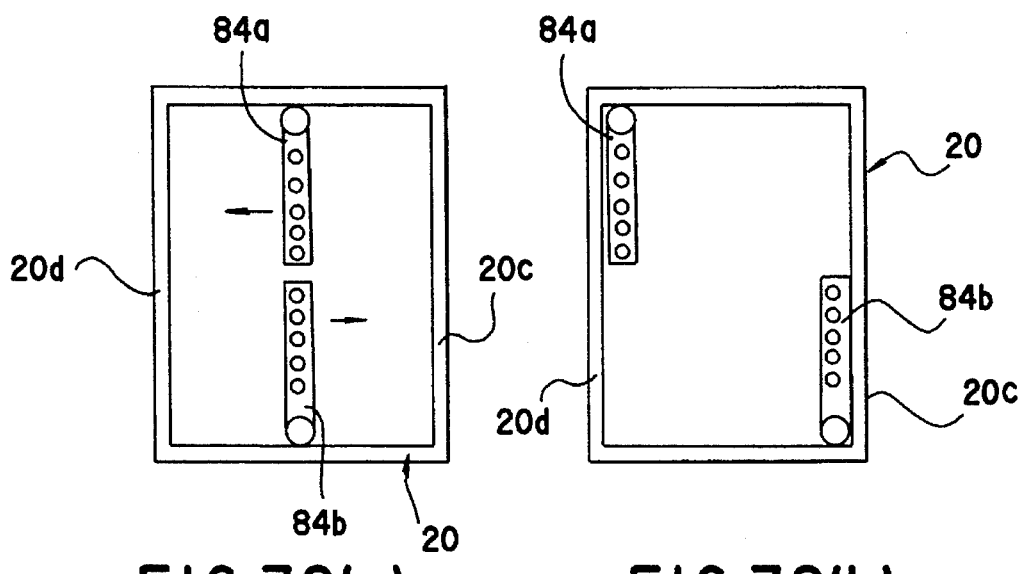
FIGS. 32(a) and (b) is a diagram illustrating a modification of the cleaning equipment shown in FIGS. 29 and 30.

The moving feed pipe 84 may be divided into a first moving pipe 84a and a second moving pipe 84b as shown in FIG. 32(a). In this case, the first moving pipe 84a and the second moving pipe 84b are respectively separated and move toward the rear wall 20d and the front wall 20c, as shown in FIG. 32(b).

Figure 33A:
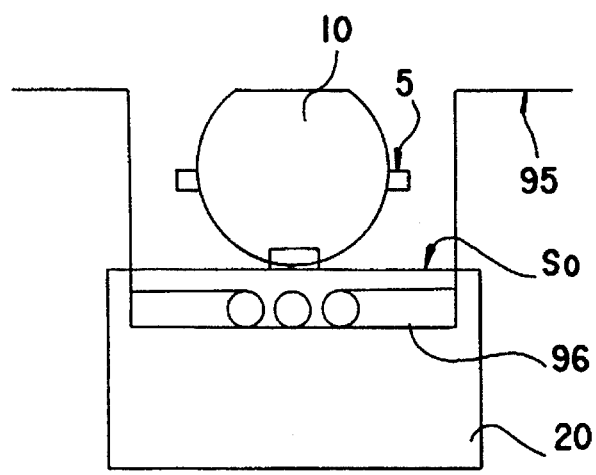
FIGS. 33(a) and (b) are diagrams illustrating another embodiment of the cleaning equipment.
Figure 33B:
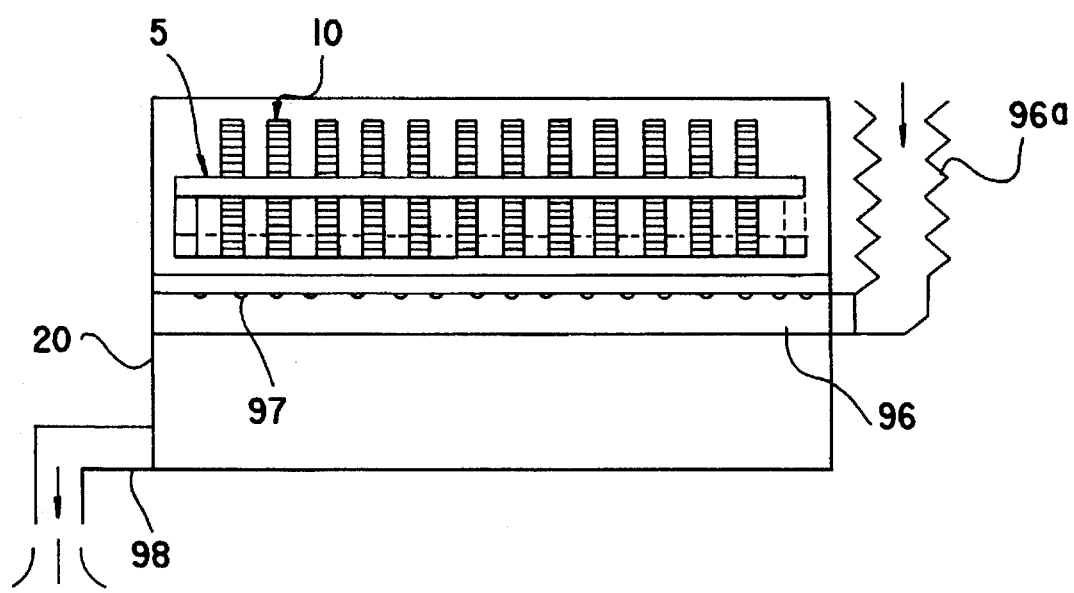

FIGS. 33(a) and (b) and 34(a) and (b) show the cleaning equipment according to a second embodiment of the present invention.

Referring to FIGS. 33(a) and (b), a feed pipe unit 96 is supported by a supporting arm 95 connected to a lifter mechanism (not shown). A plurality of orifices 97 are formed on each pipe of the feed pipe unit 96 so as to be arranged in predetermined intervals. The feed pipe unit 96 is positioned at an initial position near the opening surface So of the cleaning bath 20. The feed pipe unit 96 is provided with the cleaning liquid 100 from the cleaner supply mechanism via a flexible hose 96a. The hanger 5 supporting the semiconductor wafers 10 is fixed on a lifter mechanism. This lifter mechanism operates in synchronism with the lifter mechanism on which the feed pipe unit is fixed. The cleaning liquid 100 filling the cleaning bath 20 is gradually ejected via an ejection pipe 98.

In the above cleaning equipment, in the a state where cleaning bath is filled with the cleaning liquid 100, the cleaning liquid 100 is jetted from the feed pipe unit 96 positioned at the initial position as shown in FIG. 34(a). At this time, since the feed pipe unit 96 is near the opening surface So of the cleaning bath 20, the surface of the cleaning liquid bulges in a stable manner. The lifter on which the feed pipe unit 96 is fixed and the lifter on which the hanger 6 supporting the semiconductor wafers 10 is fixed go down in synchronism with each other. As a result, the semiconductor wafers 10 are gradually carried into the cleaning liquid 100. When the feed pipe unit 96 reaches the bottom position, the semiconductor wafers 10 are completely immersed in the cleaning liquid 100 as shown FIG. 34(b). In this state, the semiconductor wafers 10 are rinsed.

FIG. 50 shows another embodiment of the cleaning bath.

Figure 35:
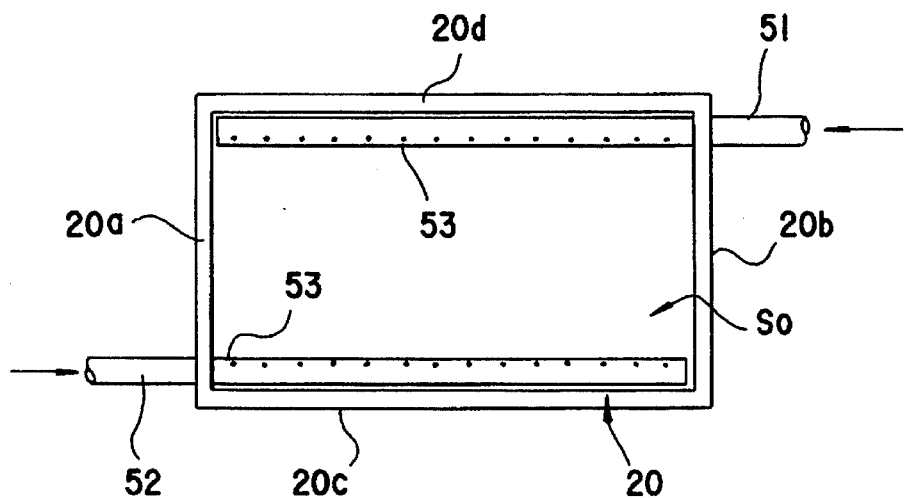
FIG. 35 is a diagram illustrating an example of the cleaning bath.

In reference to FIG. 35, inner surfaces of the front and rear walls 20c and 20d of the cleaning bath 20 are respectively provided with feed pipes 51 and 52. The feed pipes 51 and 52 are positioned near a center between the bottom surface of the cleaning bath 20 and the opening surface $S_0$ thereof, and are approximately parallel to each other. Orifices 53 are formed on each of the feed pipes 51 and 52 so as to be arranged at predetermined intervals. The feed pipes 51 and 52 are adjusted so that the orifices 53 face the center line of the opening surface $S_0$ which line is parallel to the front and rear walls 20c and 20d.

Figure 36:
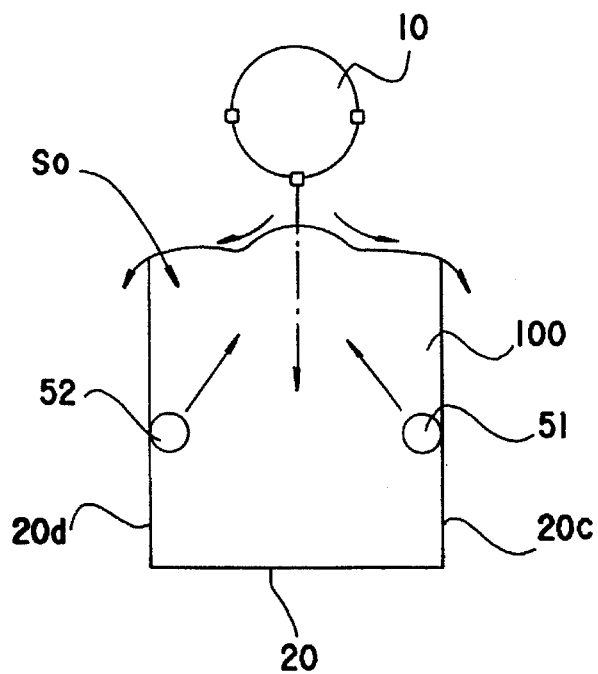
FIG. 36 is a diagram illustrating a state where the cleaning liquid is jetted in the cleaning bath shown in FIG. 35.

When the cleaning water 100 is supplied to the feed pipes 51 and 52, the cleaning water 100 is jetted from the orifices 53 of both the feed pipes 51 and 52 toward the center line of the opening surface $S_0$. The jetting pressure of the cleaning water 100 from the orifices 53 is controlled so that the surface of the cleaning water 100 bulges along the center line of the opening surface $S_0$ as shown in FIG. 36. In this state, the semiconductor wafers 10 are brought into the cleaning water 100 from the position at which the surface of the cleaning water 100 bulges in the same manner as in the above case. Thus, while the semiconductor wafers 10 are brought into the cleaning water 100, particles on the surfaces of each of the semiconductor wafers 10 flow out from the cleaning bath 20 with the stream formed on the surface of the cleaning water 100.

A description will now be given, with reference to FIGS. 37, 38 and 39, of examples of the cleaning bath in which streams are further formed, in a stable manner, on the surface of the cleaning water.

Figure 37:
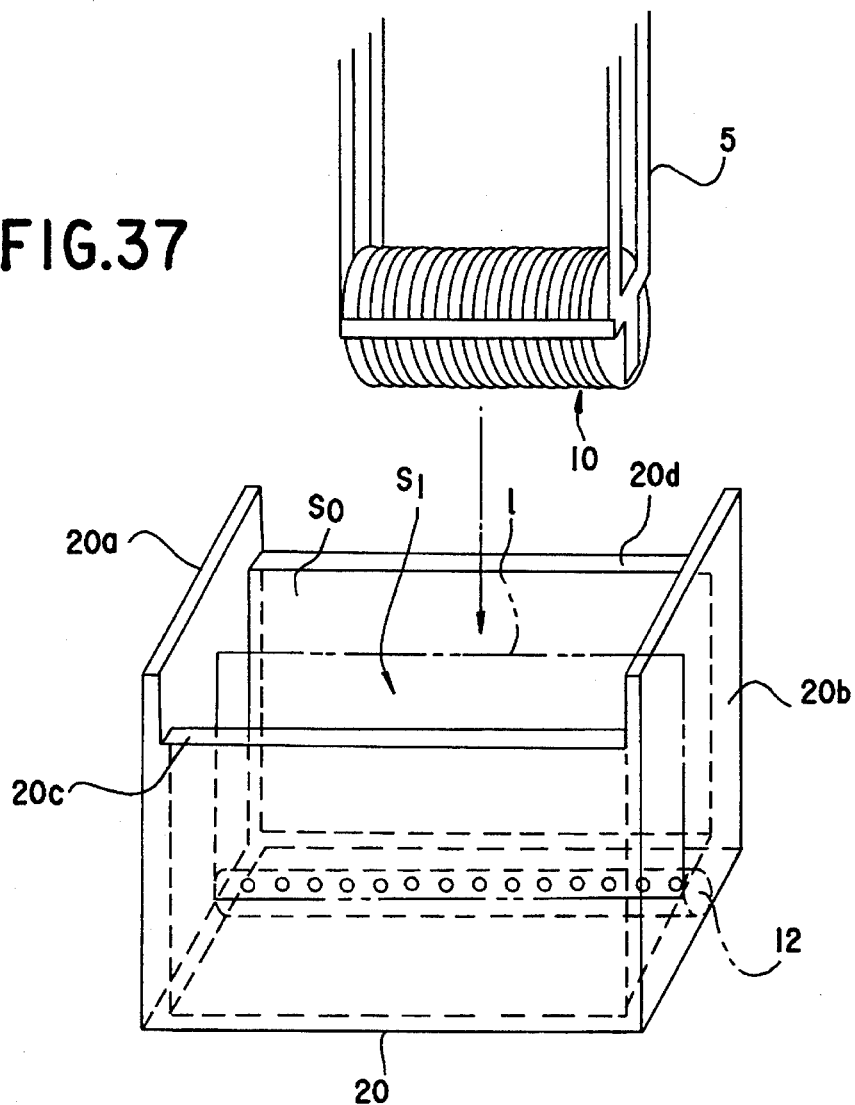
FIG. 37 is a diagram illustrating an example of the cleaning bath.
Figure 38:
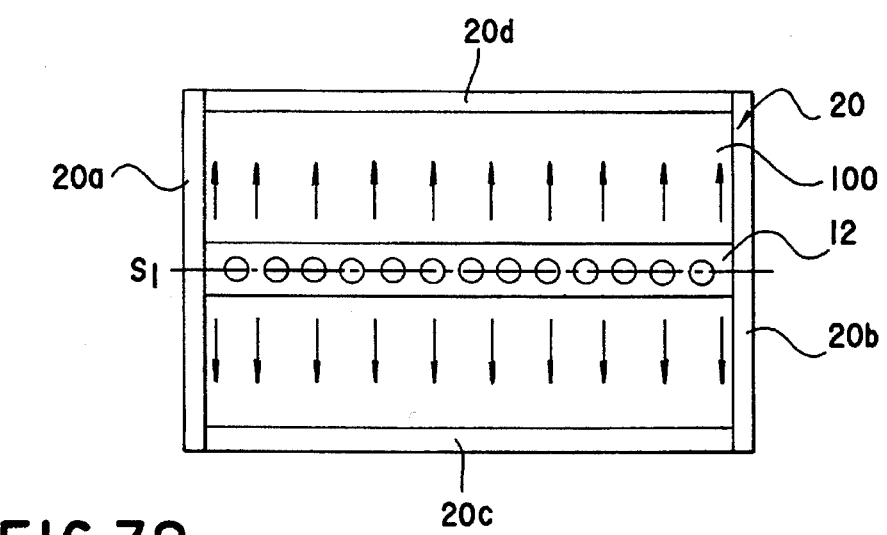
FIG. 38 is a diagram illustrating streams formed on the surface of the cleaning liquid in the cleaning bath shown in FIG. 37.
Figure 37:
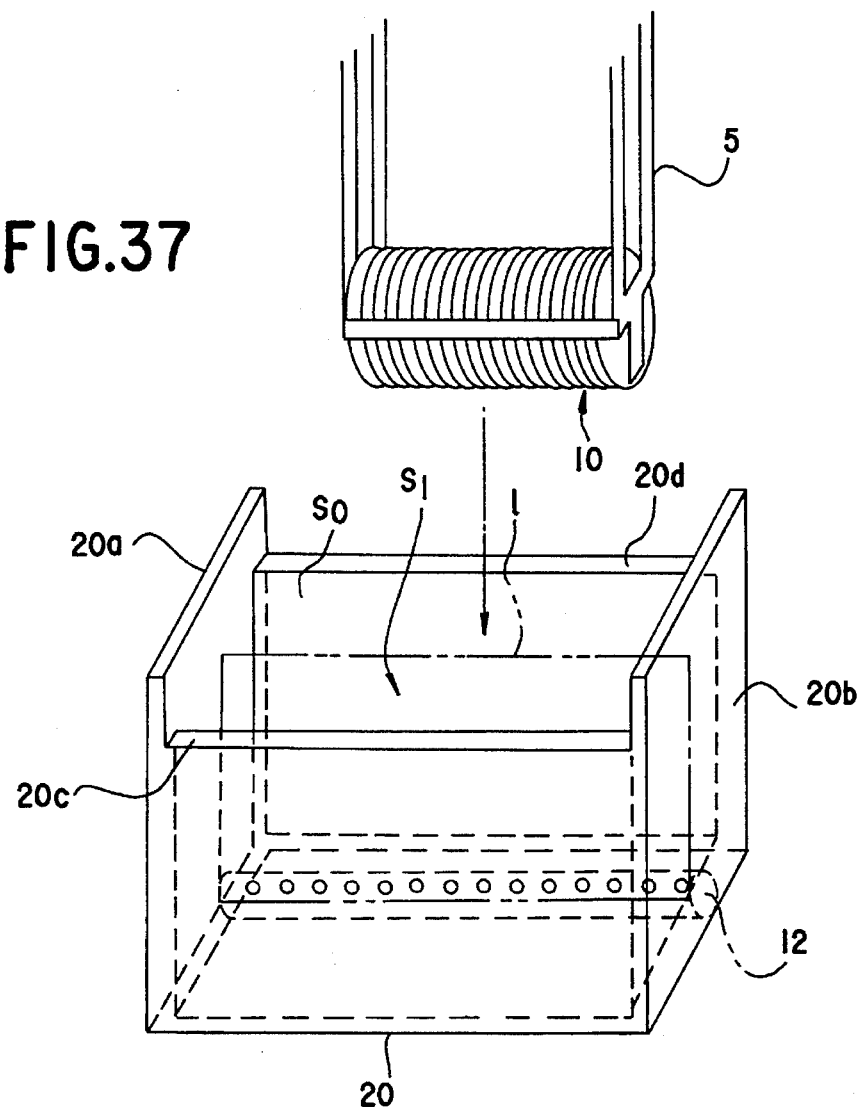
Figure 38:
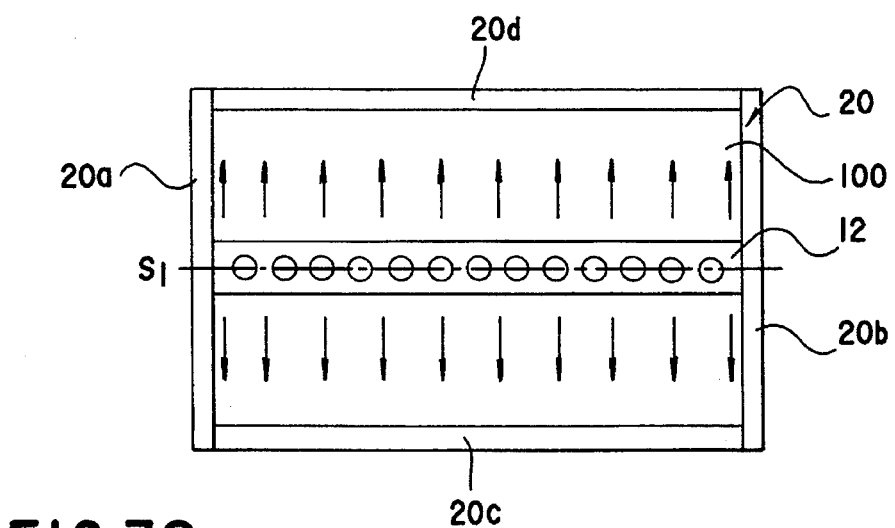

A first example is shown in FIGS. 37 and 38. Referring to FIG. 39, the front and rear walls 20c of the cleaning bath 20 and 20d are lower than the side walls 20a and 20b thereof. Due to this structure of the cleaning bath 20, the cleaning water 100 does not flow out over the side walls 20a and 20b. Thus, when the surface of the cleaning water 100 bulges along the intersection line 1 formed by the intersection of the opening surface $S_0$ and the plane $S_1$ including the feed pipe 12 and perpendicular to the opening surface $S_0$, the streams mostly being directed away from the plane $S_1$ are stably formed on the surface of the cleaning liquid 100 extending from the side wall 20a and the side wall 20b opposite thereto, as shown in FIG. 38. As a result, the probability that the particles floating on the surface of the cleaning liquid 100 adhere to the surfaces of each of the semiconductor wafers 10 further decreases.

Figure 39:
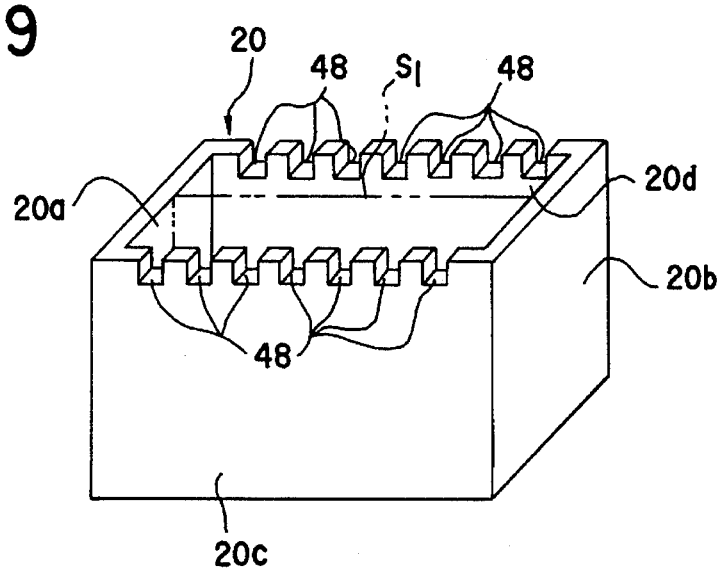
FIG. 39 is a diagram illustrating an example of the cleaning bath.

A second example is shown in FIG. 39. Referring to FIG. 39, grooves 48 are formed on the top of the front and rear walls 20c and 20d of the cleaning bath 20. In the second example, the cleaning water 100 flows out from the cleaning bath 20 mostly through the grooves 48 of the front and rear walls 20c and 20d. Thus, the stable stream being directed away from the plane $S_1$ are formed in almost the same manner as the first example.

Figure 41:
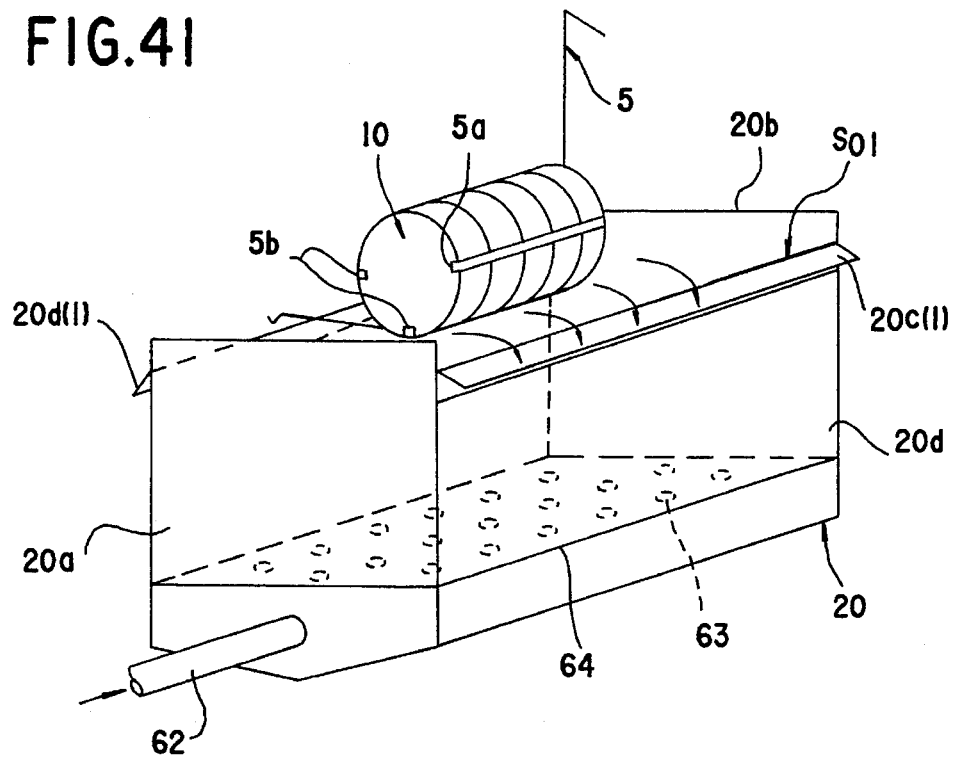
Figure 42:
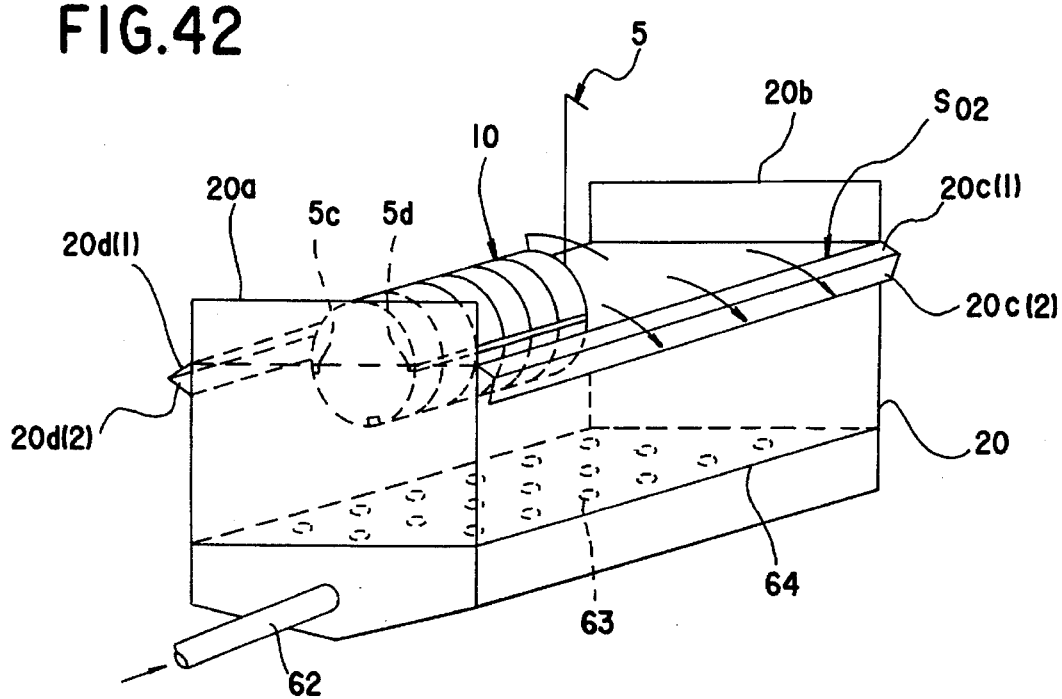

A description will now be given, with reference to FIGS. 40, 41, and 42, of a rinsing method according to another embodiment of the present invention.

Figure 40:
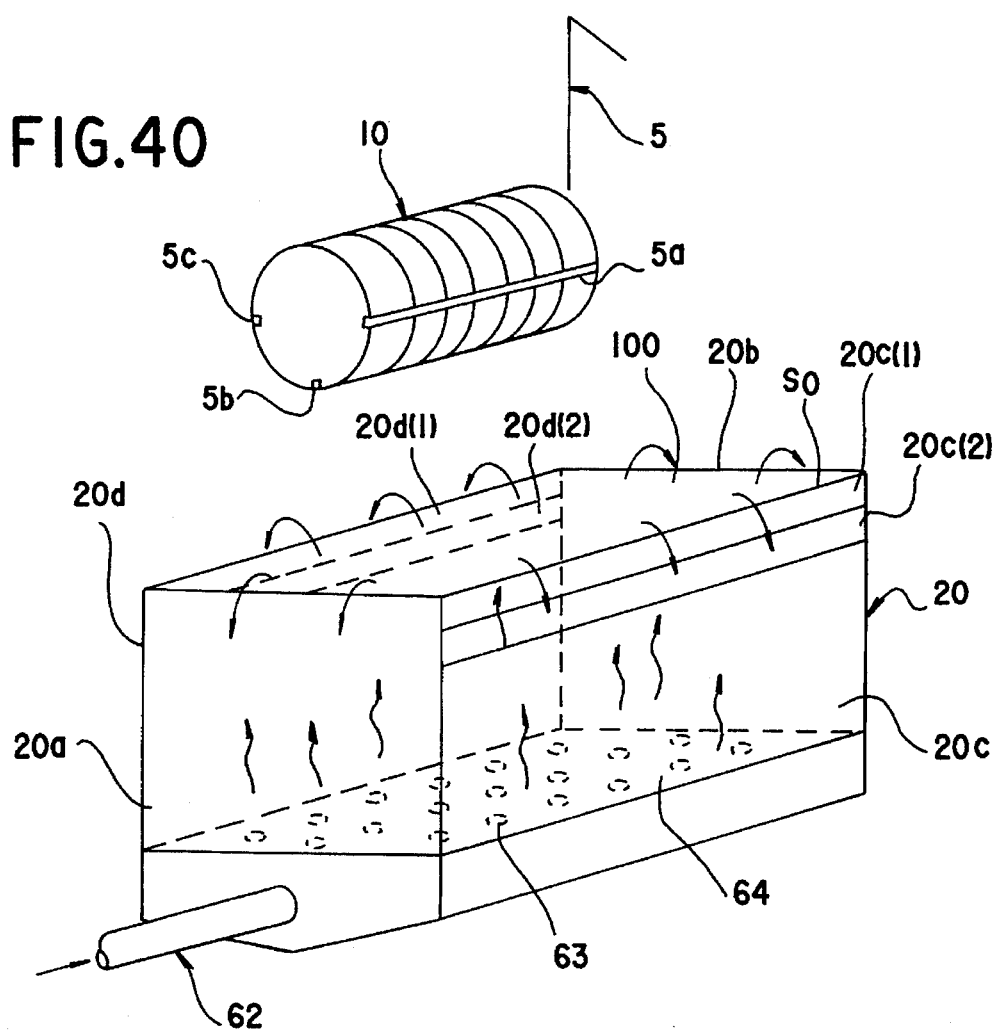
FIGS. 40, 41 and 42 are diagrams illustrating another embodiment of the rinsing method.

FIG. 40 shows an outline of a structure of a cleaning equipment used in the rinsing method according to the present invention. In reference to FIG. 40, a partition plate 64 is provided in the cleaning bath 20 at a predetermined position above the bottom surface of the cleaning bath 20. The partition plate 64 is provided with many orifices 63 formed thereon. The side wall 20a of the cleaning bath 20 is connected with a supplying pipe 62 so that the cleaning water 100 is supplied via the supplying pipe 62 to a space between the partition plate 64 and the bottom surface of the cleaning bath 20. The cleaning water 100 supplied to the space under the partition plate 64 is jetted upward from the respective orifices 63. The cleaning water 100 fills the cleaning bath 20 and flows out therefrom through the opening surface $S_0$. The front wall 20c has a first folding wall 20c(1) and a second folding wall 20c(2) both of which are formed of an upper side of the front wall 20c. The first folding wall 20c(1) is connected to the second folding wall 20c(2) so as to be able to be folded about a borderline between the first and second folding walls 20c(1) and 20c(2). The second folding wall 20c(2) is connected to the remaining part of the front wall 20c so as to be able to be folded about a borderline between the second folding wall 20c(2) and the remaining part of the front wall 20. The rear wall 20d has a first folding wall 20d(1) and a second folding wall 20d both of which are able to be folded in the same manner as those of the front wall 20c.

The cleaning bath 10 having the above structural arrangement is filled with the cleaning water 100 and the cleaning water 100 flows out from the cleaning bath 20 through the opening surface $S_0$ (the overflowing surface). In this state, the semiconductor wafers 10 supported by the respective hanger arms 5a, 5b and 5c of the robot hanger 5 are gradually lifted down. Then, immediately before the hanger arm 5b, which supports the lower edge of each of the semiconductor wafers 10, reaches the surface of the cleaning water 100 in the cleaning bath 20, the first folding walls 20c(1) and 20d(1) of the front and rear walls 20c and 20d are folded, as shown in FIG. 41. The overflowing surface of the cleaning bath 20 then goes down from the initial opening surface $S_0$ to an opening surface $S_{01}$ depending on positions at which the first folding walls 20c(1) and 20d(1) are folded. Thus, uniform streams being directed toward the front and rear walls 20c and 20d are formed on the surface of the cleaning water 100. While the state where the uniform streams being directed toward the front and rear walls 20c and 20d are formed is maintained, the semiconductor wafers 10 are gradually brought into the cleaning water 100. During this, the particles collected on regions in which the hanger arm 5b and the semiconductor wafers are in contact with each other flow out together with the streams formed on the surface of the cleaning water 100 from the cleaning bath 20 through the opening surface $S_{01}$. The cleaning water 100 flows out from the cleaning bath 20 and the surface of the cleaning water 100 gradually goes down. When the surface of the cleaning water 100 reaches the opening surface $S_{01}$, the streams formed on the surface of the cleaning water 100 are in almost the same state as those in the initial state shown in FIG. 40. The semiconductor wafers 10 further sink into the cleaning water 100. Then, immediately before the hanger arms 5a and 5c, which support the side edges of the semiconductor wafers 10, reach the surface of the cleaning water 100, the second folding walls 20c(2) and 20d(2) of the front and rear walls 20c and 20d as shown in FIG. 42. The overflowing surface of the cleaning bath 20 then further goes down from the opening surface $S_{01}$ to an opening surface $S_{02}$ depending on positions at which the second folding walls 20c(2) and 20d(2) are folded. Thus, uniform streams being directed toward the front and rear walls 20c and 20d are formed on the surface of the cleaning water 100 again. While the streams being directed toward the front and rear walls 20c and 20d are formed, the semiconductor wafers 10 are gradually brought into the cleaning water 100. During this state, the particles collected on regions in which the hanger arms 5a and 5c and the semiconductor wafers 10 are in contact with each other flow out with the stream formed on the surface of the cleaning water 100 from the cleaning bath 20 through the opening surface $S_{O2}$. Consequently, the semiconductor wafers 10 are completely immersed in the cleaning water 100 and rinsed therein.

In the above-described embodiment, the level of the overflowing surface, through which the cleaning water flows out successively, goes down. The uniform streams being directed toward the front and water rear walls 20c and 20d are formed on the cleaning water 100 every time the overflowing surface goes down in one step. Thus, the particles on the surfaces of each of the semiconductor wafers 10 flow out with the stream from the cleaning bath 20, so that most of the particles do not remain on the surface of the cleaning water 100.

Experiments

Figure 1A:
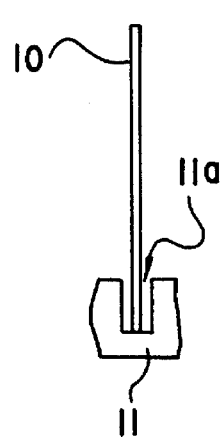
FIG. 1 is a diagram illustrating a structure in which a semiconductor wafer is supported by a carrier.
Figure 1B:
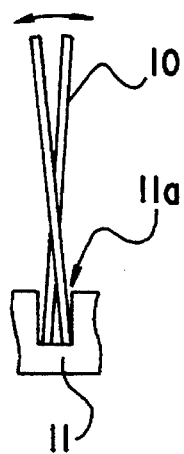
Figure 2A:
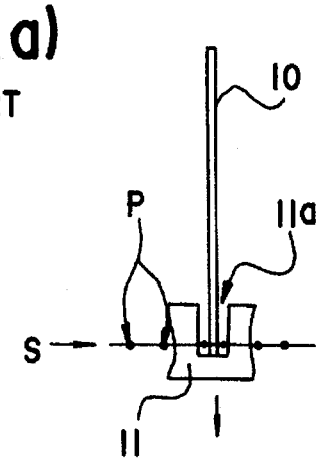
FIG. 2 is a diagram illustrating a state in which the semiconductor wafer set in the carrier is brought into still water.
Figure 2B:
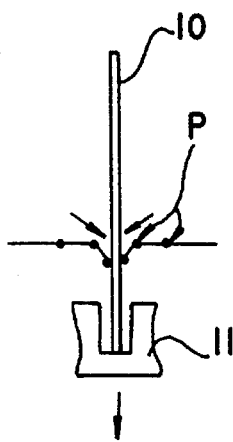
Figure 3:
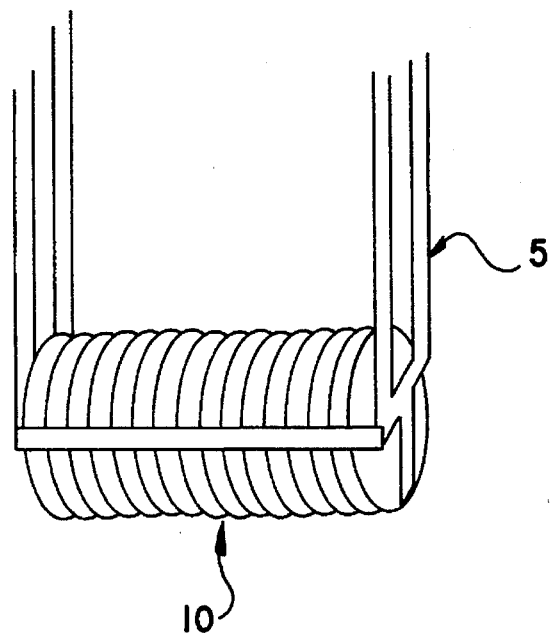
FIGS. 3 and 4 are diagrams illustrating semiconductor wafers supported by a robot hanger.
Figure 4:
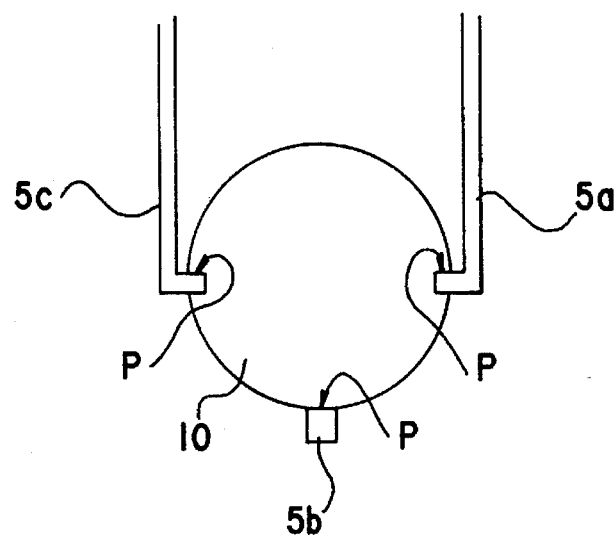
Figure 5:
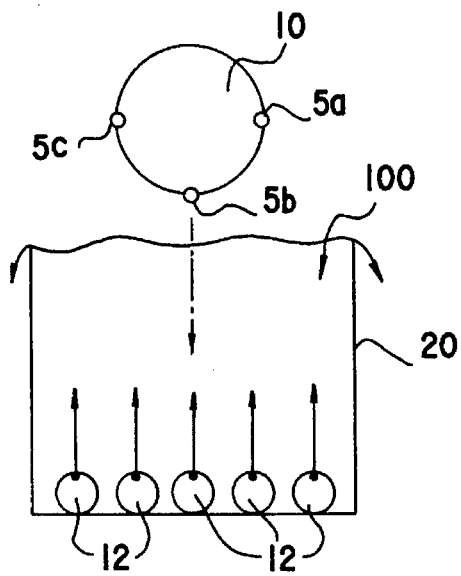
FIGS. 5 and 6 are diagrams illustrating a conventional method for rinsing the semiconductor wafers.
Figure 6:
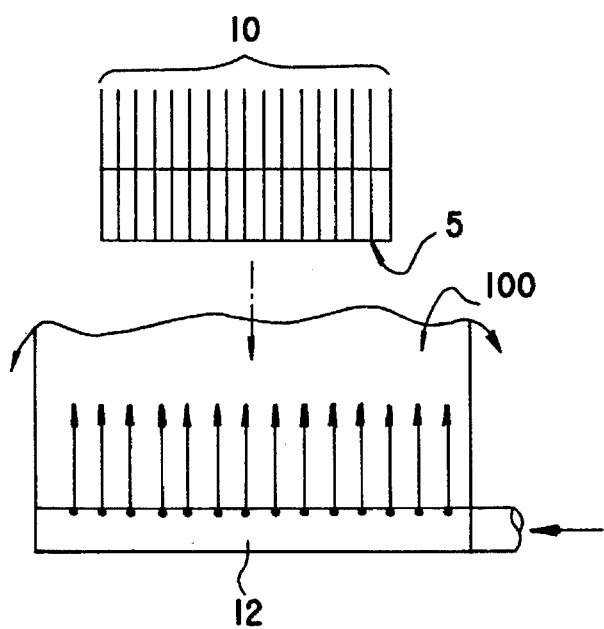
Figure 7:
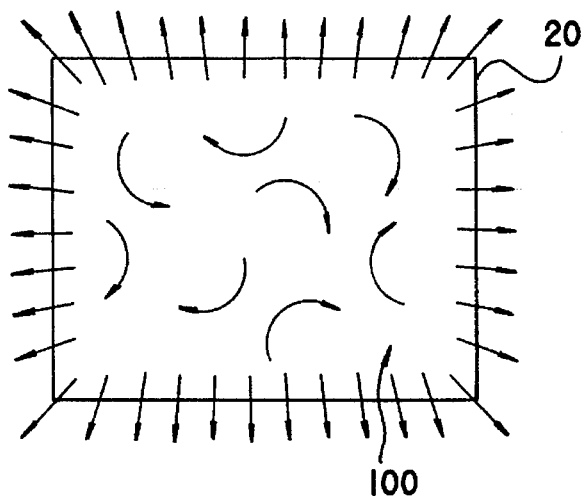
FIG. 7 is a diagram illustrating streams generated on the surface of cleaning water in a cleaning bath in a case where the semiconductor wafers are rinsed in accordance with the conventional method.

The semiconductor wafer were rinsed out in accordance with the conventional rinsing method as shown in FIGS. 5 and 6. In this case, there were 862 particles on the surface of the semiconductor wafer rinsed out. On the other hand, in a case where the semiconductor wafer was rinsed out in accordance with the rinsing method of the present invention as shown in FIGS. 9-14, there were 23 particles on the surface of the semiconductor wafer rinsed out.

The present invention can be also applied to rinse generally plate-shaped articles, such as masks and particles used in the production process of the semiconductor device and an LCD substrate.

In the cleaning bath as shown in FIG. 43 and the cleaning equipment as shown in FIG. 44, the semiconductor wafers 10 can be rinsed so that the particles are almost removed from the surfaces of the semiconductor wafers 10 in the same manner as in the above-described embodiments.

The present invention is not limited to the aforementioned embodiments, and variations and modification may be made without departing from the scope of the claimed invention.

What is claimed is:

1. A method for rinsing a plate-shaped article through immersion in a cleaning liquid in a cleaning bath having a surface $S_0$, through which the cleaning liquid flows out, said method comprising the steps of:

(a) forming streams of cleaning liquid by substantially directing the streams of cleaning liquid away from a plane $S_1$, wherein the step of forming streams of cleaning liquid comprises the step of forming a bulge portion of the cleaning liquid along an intersection line, wherein said intersection line intersects the $S_0$ surface and extends along the $S_1$ plane, said $S_1$ plane extending from the $S_0$ surface to a bottom portion of said cleaning bath and being substantially perpendicular to the $S_0$ surface; and (b) bringing the plate-shaped article into said bulge portion of the cleaning liquid so as to intersect the $S_1$ plane such that the surfaces of the plate-shaped article are substantially parallel to the streams of cleaning liquid directed away from the $S_1$ plane on the surface of the cleaning liquid, wherein said step of forming said streams of cleaning liquid includes the step of causing the $S_0$ surface of the cleaning bath to go down by reducing the heights of the walls of said cleaning bath which walls face the $S_1$ plane so that the streams of cleaning liquid which are substantially directed away from the $S_1$ plane to said walls facing the $S_1$ plane are formed.

2. A method for rinsing a plate-shaped article through immersion in a cleaning liquid in a cleaning bath having a surface $S_0$, through which the cleaning liquid flows out, said method comprising the steps of:

(a) forming streams of cleaning liquid by substantially directing the streams of cleaning liquid away from a plane $S_1$, wherein the step of forming streams of cleaning liquid comprises the step of forming a bulge portion of the cleaning liquid along an intersection line, wherein said intersection line intersects the $S_0$ surface and extends along the $S_1$ plane, said $S_1$ plane extending from the $S_0$ surface to a bottom portion of said cleaning bath and being substantially perpendicular to the $S_0$ surface; and (b) bringing the plate-shaped article into said bulge portion of the cleaning liquid so as to intersect the $S_1$ plane such that the surfaces of the plate-shaped article are substantially parallel to the streams of cleaning liquid directed away from the $S_1$ plane on the surface of the cleaning liquid, wherein the step of forming said bulge portion includes the step of jetting the cleaning liquid from a lower part of said cleaning bath toward the $S_0$ surface of said cleaning bath under a condition in which a jetting pressure of the cleaning liquid decreases with increasing distance from the $S_1$ plane so that the surface of the cleaning liquid bulges along said intersection line of the $S_0$ surface of the cleaning bath and $S_1$ plane.

* * * * *